US008658937B2

(12) United States Patent
Harte et al.

(10) Patent No.: US 8,658,937 B2
(45) Date of Patent: Feb. 25, 2014

(54) METHOD AND APPARATUS FOR PROCESSING SUBSTRATE EDGES

(75) Inventors: Kenneth J. Harte, Carlisle, MA (US); Ronald P. Millman, Jr., Taunton, MA (US); Victoria M. Chaplick, Charlton, MA (US); David J. Elliott, Carlisle, MA (US); Eugene O. Degenkolb, Newton, MA (US); Murray L. Tardif, Dunstable, MA (US)

(73) Assignee: UVTech Systems, Inc., Sudbury, MA (US)

( * ) Notice: Subject to any disclaimer, the term of this patent is extended or adjusted under 35 U.S.C. 154(b) by 241 days.

(21) Appl. No.: 12/986,914

(22) Filed: Jan. 7, 2011

(65) Prior Publication Data

US 2011/0168672 A1    Jul. 14, 2011

Related U.S. Application Data

(60) Provisional application No. 61/293,325, filed on Jan. 8, 2010, provisional application No. 61/419,602, filed on Dec. 3, 2010.

(51) Int. Cl.
*B23K 26/36* (2006.01)
*H01L 21/00* (2006.01)

(52) U.S. Cl.
USPC ............ 219/121.68; 219/121.69; 219/121.76; 219/121.77; 264/400; 264/482; 438/795; 451/44; 257/E21.257

(58) Field of Classification Search
USPC ................ 216/58, 63, 65–67, 2; 156/345.29, 156/345.33, 345.39–345.42, 345.54; 219/121.68, 121.69, 121.76, 121.77; 700/166; 264/400, 482; 438/795; 257/E21.257; 451/44; 134/1.3
See application file for complete search history.

(56) References Cited

U.S. PATENT DOCUMENTS 5,302,547 A    4/1994    Wojnarowski et al.
5,392,989 A    2/1995    Hurtig
(Continued)

FOREIGN PATENT DOCUMENTS

JP    59089711 A  *  5/1984
JP    2006-49870 A    2/2006
WO    WO 2008/044394 A1    4/2008

OTHER PUBLICATIONS

Rinnen, K., et al., "Forecast: Semiconductor Wafer Fab Equipment, Worldwide, 4Q07 Update," Gartner Dataquest, Gartner, Inc. Fab Database: Worldwide, 2009, 25 pages (2007).

(Continued)

*Primary Examiner* — Samuel M Heinrich
(74) *Attorney, Agent, or Firm* — Cesari and McKenna, LLP

(57) ABSTRACT

A method and apparatus for processing substrate edges is disclosed that overcomes the limitations of conventional edge processing methods and systems used in semiconductor manufacturing. The edge processing method and apparatus of this invention includes a laser and optical system to direct a beam of radiation onto a rotating substrate supported by a chuck, in atmosphere. The optical system accurately and precisely directs the beam to remove or transform organic or inorganic films, film stacks, residues, or particles from the top edge, top bevel, apex, bottom bevel, and bottom edge of the substrate. An optional gas injector system directs gas onto the substrate edge to aid in the reaction. Process by-products are removed via an exhaust tube enveloping the reaction site. This invention permits precise control of an edge exclusion zone, resulting in an increase in the number of usable die on a wafer. Wafer edge processing with this invention replaces existing solvent and/or abrasive methods and thus will improve die yield.

80 Claims, 25 Drawing Sheets

(56) References Cited

U.S. PATENT DOCUMENTS

| | | |
|---|---|---|
| 6,406,589 B1 | 6/2002 | Yanagisawa |
| 6,482,199 B1 | 11/2002 | Neev |
| 6,495,312 B1 | 12/2002 | Young et al. |
| 6,508,990 B1 * | 1/2003 | Yoshida et al. .......... 422/186.05 |
| 6,635,844 B2 | 10/2003 | Yu |
| 6,676,878 B2 | 1/2004 | O'Brien et al. |
| 6,874,510 B2 | 4/2005 | Reder et al. |
| 6,881,687 B1 | 4/2005 | Castrucci |
| 7,170,912 B2 | 1/2007 | Chen |
| 7,182,821 B2 | 2/2007 | Izumi et al. |
| 7,267,726 B2 | 9/2007 | Xia |
| 7,270,136 B2 | 9/2007 | Ko et al. |
| 7,460,211 B2 | 12/2008 | Whitefield et al. |
| 7,528,342 B2 | 5/2009 | Deshi |
| 7,651,585 B2 | 1/2010 | Yoon et al. |
| 7,745,095 B2 | 6/2010 | Wong et al. |
| 8,216,382 B2 | 7/2012 | Shindo |
| 2003/0154001 A1 | 8/2003 | Oh |
| 2003/0197570 A1 | 10/2003 | Kim et al. |
| 2004/0126923 A1 | 7/2004 | Benson |
| 2006/0176084 A1 * | 8/2006 | Suzuki et al. .................... 327/53 |
| 2006/0278254 A1 * | 12/2006 | Jackson .......................... 134/21 |
| 2007/0093067 A1 | 4/2007 | Chang et al. |
| 2007/0138151 A1 * | 6/2007 | Tanaka et al. ............ 219/121.65 |
| 2007/0176084 A1 | 8/2007 | Shyu et al. |
| 2008/0010845 A1 * | 1/2008 | Bailey et al. ..................... 33/520 |
| 2008/0017613 A1 * | 1/2008 | Nogami et al. .................. 216/58 |
| 2008/0073324 A1 * | 3/2008 | Nogami et al. .................. 216/58 |
| 2008/0160457 A1 * | 7/2008 | Collins et al. ................. 430/322 |
| 2008/0277061 A1 * | 11/2008 | Kobayashi et al. ......... 156/345.5 |
| 2008/0289651 A1 * | 11/2008 | Cheng et al. .................... 134/1.3 |
| 2008/0314879 A1 | 12/2008 | Bruland et al. |
| 2009/0029629 A1 | 1/2009 | Shin et al. |
| 2009/0038637 A1 * | 2/2009 | LeClaire et al. ................. 134/1 |
| 2009/0044831 A1 | 2/2009 | Yudovsky et al. |
| 2010/0051073 A1 | 3/2010 | Iwase et al. |
| 2010/0099265 A1 | 4/2010 | Yoon et al. |
| 2010/0147327 A1 | 6/2010 | Kondo et al. |
| 2010/0187207 A1 * | 7/2010 | Lee et al. ................. 219/121.72 |
| 2010/0190416 A1 | 7/2010 | Schwarzenbach et al. |
| 2010/0285399 A1 | 11/2010 | Huang et al. |

OTHER PUBLICATIONS

Singer, P., et al., "How Green is Your Valley," Solid State Technology, Editorial, Mar. 2009.

Handbook of Semiconductor Cleaning Technology, Ed. Werner Kern, ISBN 0-8155-1331-3, p. 20 (1993).

International Search Report and Written Opinion of PCT/US11/62832 dated Jan. 24, 2012.

International Search Report from PCT/US11/00036 dated Dec. 19, 2011.

* cited by examiner

*Closed (Centering) Position*

*Open (Operating) Position*

P = Total path length

*Top View*

*Front View*

*Side View*

*Top View*

*Side View*

5mm annulus
80 die affected 0.6mm annulus
16 die affected

METHOD AND APPARATUS FOR PROCESSING SUBSTRATE EDGES

RELATED APPLICATION(S)

This application claims the benefit of U.S. Provisional Application No. 61/293,325, filed on Jan. 8, 2010 and U.S. Provisional Application No. 61/419,602, filed on Dec. 3, 2010. The entire teachings of the above application(s) are incorporated herein by reference.

TECHNICAL FIELD

This patent application generally relates to wafer processing in the manufacture of integrated circuits, and to a method and apparatus for removal of films from semiconductor substrates at various stages of processing.

It specifically relates to a laser-based edge cleaning system for the removal of organic, inorganic, and other semiconductor films from the edges of silicon wafers or other substrates. It also relates to a method and apparatus for laser beam delivery in an edge cleaning system to remove organic, inorganic, and other semiconductor films or other materials from the edges of silicon wafers or other substrates. These films are removed in order to reduce the number of defects generated around the periphery of the wafers that cause loss of good die in integrated circuit manufacturing.

BACKGROUND OF THE INVENTION

In the fabrication of semiconductors, a number of different types of films are formed on the surface of a semiconductor substrate. These films may be organic polymer films, such as photoresists which are masking materials used to define the integrated circuit patterns, or they may be residues remaining after an etching operation, such as a post-etch polymer. Other types of films include multi-layer films comprised of both organic and inorganic materials. For example, some tri-layer films are used that have three different types of films: an organic polymer, a carbon-based film, and a silicon-containing film.

Many types of processes are used that result in films or residues left on the wafer edges. These processes include photoresist coatings, dielectric and metal deposition, plasma etching, and chemical mechanical polishing (CMP). Undesirable particles, residues and films are left on the wafer edges from these processes. The relevant surfaces include the top (or front), top bevel, apex, bottom bevel, and bottom (or back) edges of wafers. These edges are further specified in the International Standards published by Semiconductor Equipment and Materials International (SEMI) of San Jose, Calif. and referred to as the SEMI M1-1109 and SEMI M73-0309 specification documents.

During semiconductor manufacturing, wafers are transported from one machine to another in cassettes, and once in the machine, are moved in and out of chambers with robots. As a consequence, the films at the very edges of the wafers become abraded, cracked, and broken. Contamination, in the form of cracked portions of films, gets lodged onto vacuum chucks, robotic arms, and cassettes. The same flakes of photoresist and other edge-based films will be deposited onto the topside where there are active die, causing costly yield loss. Backside contamination will distort the wafer during subsequent imaging, also causing yield loss. Therefore, it is desirable to perform edge-cleaning operations on the edges of wafers.

One source of wafer edge defects is the formation of a photoresist edge bead, caused when the wafers are spin coated prior to lithographic imaging. A thickened ring of photoresist is left at the outermost top edge. Excess photoresist also runs down the sidewall or bevel edge of the wafer, and further runs under to the bottom edge. The photoresist bead on the top edge is easily cracked by robots handling the wafers, resulting in flakes of photoresist re-depositing on good die, causing yield loss. The photoresist on the wafer's bottom edge sticks to vacuum chucks, causing leveling problems in lithography, and creating more cracked flakes of photoresist. The same problem occurs with the photoresist left on the bevel and apex edges. Photoresist spin coating is repeated many times in the fabrication of an integrated circuit chip, depending on the number of lithographic levels used to make the device.

Another example is residue left behind from plasma etching. These etch residues are thin, tough films like halogenated polymers. They are deposited mainly at the wafer's bevel, apex, and bottom edges. They cannot be removed by conventional wet chemical means, and typically must be physically ground off with a grinder in combination with a fluid to make a slurry. This is a messy and particle-generating process that may leave more defects behind than were on the original wafer. If these etch residues are not removed, they will crack, break up and leave particles on good parts of the wafer, causing die loss. During wafer processing operations, robotic handlers, used to transport the wafers from one tool or operation to another, grip the edges of the wafers and cause cracking and flaking of the photoresist, etch residue films, and other films on the wafer edge. Particles will re-deposit on good portions of wafers and on process equipment, causing defects and loss of good die. These defects also contaminate the process equipment, leading to equipment reliability problems, and tool down time. Therefore, it is necessary to clean the edges of the wafers and remove these edge-based beads, residues, particles, and films in order to reduce wafer defects and maximize the yield of good die on every wafer processed.

Another example of an edge-cleaning problem is defects resulting from chemical-mechanical polishing (CMP) residue. CMP slurries flow around the apex of wafers and onto the bottom edges. These residues and particles migrate onto vacuum chucks, robotic handlers, and other wafer processing equipment.

Yet another example of an edge-cleaning problem arises from the use of silicon-containing photoresist. The silicon content can typically be up to 50% of the polymer content, and conventional removal methods, such as wafer edge exposure and development (WEE) or solvent cleaning, will not completely remove these silicon based films.

Finally, edge cleaning necessarily consumes some of the usable space or area on a wafer. This space is very significant, since gaining only 4 die per wafer, on a typical or medium-sized 10,000 wafer start/month line, will result in gained revenue of an estimated $40 million per year. Therefore, considerable effort is given to keep the edge cleaning area, called the edge exclusion, to a minimum. The International Technology Roadmap for Semiconductors (ITRS) specifies the parameters for integrated circuit production into the future, and the semiconductor industry companies follow this path. The ITRS, specifically in the area of edge exclusion, indicates the need to move from current 3-5 mm edge exclusion down to 1 mm or less in the next two years. Conventional wet edge bead cleaning methods are unable to control edge exclusion to this level due to the natural movement of liquids on smooth surfaces, such as a highly polished silicon wafer. It is recognized by those practiced in the art that a non-liquid means of edge cleaning is needed to meet the ITRS guidelines.

PROBLEMS WITH THE PRIOR ART

Several conventional methods, known as edge bead removal (EBR), are used to clean the edges of silicon wafers. Each of these methods is specifically directed at the removal of a particular film, and since there are several different categories of films, there are several conventional methods.

Two conventional methods are used for the removal of photoresist edge bead films, generated when photoresist is spin coated and excess photoresist runs over the top edge, leaving non-uniform coatings on the bevels, apex, and bottom edge where it can run as far as 10 mm onto the bottom. It also coats the notch in the wafer, where it can be thicker. The first conventional method is called wafer edge exposure and development (WEE), a two-step process described below in a prior art patent. The second conventional method for photoresist removal from wafer edges is solvent spraying or solvent cleaning Post-etch residues are thin, tough films that must be either removed with a grinding wheel, which leaves many undesirable particles, or removed by plasma etching, involving complex vacuum equipment and toxic gas.

Multi-layer, silicon based photoresists are film stacks with layers containing silicon, along with layers containing polymers. The conventional method for removal of these more complex films involves wet chemical EBR, using etchants, solvents, rinsing and drying.

Thus there are many film types to be removed from wafer edges, each requiring specific edge cleaning methods. Edge bead removal processing in semiconductor manufacturing is therefore complex and costly, since so many different types of chemicals and tools for edge cleaning are used. Each of these conventional methods is described in more detail below with reference to specific prior art.

Several systems of the prior art have been used to remove films occurring at the wafer edge during semiconductor manufacturing. There are six major categories of prior art methods currently being used in the industry, each having specific limitations. These categories are as follows: edge cleaning using solvents and water, chemical etching, wafer edge exposure and development (WEE), lithographic masking, plasma etching, and mechanical wafer edge cleaning In addition to the six major categories, there are also several other methods not commonly used in the industry.

The first problem of the prior art relates a method for dispensing liquid as described in U.S. Pat. No. 5,392,989 and U.S. Patent Application 2010/0051073 A1.This problem relates to the inability of the liquid solvent to control the geometry of the cleaned edge. The cleaning fluid is dispensed and spreads on the wafer surface, leaving a tapered edge of photoresist that may be several millimeters wide. The ITRS specifies a reduction of edge exclusion from the current 3-5 mm to below 1 mm in the future. The solvent cleaning EBR appears to be unable to meet this specification due to the inability to effectively control the solvents. This inability includes solvent splashing onto good die causing yield loss. Organic solvents, such as ethyl lactate or cellosolve acetate, cause environmental problems, raise safety concerns, and are costly to use. Finally, after solvent edge cleaning, a thin residue of photoresist is typically left behind, requiring further chemical processing and rinsing to remove.

The second problem of the prior art relates to etching the edge of a wafer in a chamber with acids, as described in U.S. Pat. Nos. 7,267,726 B2 and 7,182,821 B2. Some of the acids used are hydrofluoric (HF), sulfuric ($H_2SO_4$), and nitric ($HNO_3$). These chemicals are hazardous to use and require the use of complex and costly equipment, raising environmental problems and safety concerns. As with the solvent method listed above, it is difficult to effectively control the edge exclusion. This method is specifically used to remove metal films, but due to the non-uniformity of these films at the edge of the wafer, it is difficult to control the etch depth. This method is also used for removing PTFE particles, but is not effective for removing photoresists. The third problem of the prior art relates to photoresist edge bead exposure and development (WEE), as described in U.S. Pat. Nos. 6,495,312 B1, 7,460,211 B2, and U.S. Patent Application 2010/0285399 A1. This method requires two pieces of equipment to remove the photoresist edge bead: an exposure source, which is a high intensity lamp, and a separate wet developing system that uses an alkaline developer followed by a single or double rinse with high purity water. Since multiple pieces of equipment are used, this increases the time to complete, therefore limiting throughput. The exposure step is often not adequate in removal of very thick edge beads, in which case a solvent cleaning is needed in addition. This method addresses photoresist edge beads, but there are many other types of more difficult films, such as post-etch polymers, that need to be removed, but cannot be addressed with WEE. Finally, since WEE only removes films from the top edge of the wafer, the apex and bottom edge must be cleaned by another method.

The fourth problem of the prior art relates to a lithographic masking method, as described in U.S. Patent Application 2007/0093067 A1 and U.S. Pat. No. 7,745,095 B2. This method is complex in that at least four individual steps are required to clean the wafer edge. Steps may include pre-cleaning, depositing and removing of organic coatings, lithographic exposure, developing, rinsing, and drying. This method requires multiple pieces of equipment, consumes considerable volumes of solvent and water, and reduces throughput.

The fifth problem of the prior art relates to a method using reactive plasma, as described in U.S. Pat. No. 7,651,585 B2 and U.S. Patent Application 2010/0099265 A1. This method requires a complex plasma-etching machine using a vacuum chamber and reactive gases. The plasma is a non-uniform field of energetic ions surrounding the edge of the wafer. Thus there is no sharply defined border as can be achieved with a laser beam, but a gradient or slope. The complexity of the machine, as well as the vacuum chamber pump time, adds considerable cost and limits throughput. This method is specific to removing polymers from the bottom edge of a wafer.

The sixth problem of the prior art relates to mechanical methods for cleaning wafer edges as described in U.S. Patent Application 2010/0190416 A1 and U.S. Patent Application 2009/0029629 A1. Chemical mechanical polishing (CMP) uses an abrasive polishing pad and wet chemicals to polish the wafer. The byproducts of this process are polishing slurry residues left on the back and edges of the wafer. The current method for removing this slurry residue is frictional surface cleaning, as described in U.S. Patent Application 2009/0044831 A1. This method leads to loss of usable die.

There are a number of additional methods of the prior art that are not typically used in semiconductor manufacturing. One method uses frozen carbon dioxide particles to clean wafer edges, as described in U.S. Pat. No. 7,270,136 B2. The problems with this method are that the equipment used to perform this process is highly complex and expensive, and the impact of the frozen particles can cause damage to the substrate and to usable die.

Another method of the prior art, as described in U.S. Patent Application 2008/0010845 A1, relates to applying a flame to the edge of a wafer in the presence of reactive gasses including halogens and ozone. For example, a hydrogen-rich flame with oxygen and nitrogen trifluoride ($NF_3$) produces hydrogen fluoride (HF) that etches the edge of the wafer. Nitrogen trifluoride is a highly toxic and extremely expensive gas that is typically used to clean deposition chambers in semiconductor manufacturing. Further, this method may require preheating the wafer to prevent condensation of the by-products onto the wafer, causing die loss. The apparatus described is very complex since the gas plumbing and safety requirements are extreme for the types of gases proposed for this edge cleaning method. Lastly, the method cannot remove films from all three wafer edges in a single step and is not effective for photoresist removal.

Another method of the prior art, as described in U.S. Patent Application 2004/0126923 A1, uses a pressurized stream of a non-solvent medium, which may be a gas, to clean wafer edges. An expected problem with this method would be the scattering of particles onto the usable areas of the wafer, as well as the surrounding equipment. Additionally, this patent application claims that the medium must not be a solvent for the material being removed, which severely limits use on a variety of films due to its non-reactive nature.

Finally, another method of the prior art, as described in U.S. Pat. No. 6,874,510 B2, relates to the method of using an oblique-angled nozzle containing a laser beam combined with inert gas. One problem with this method is that the beam used to clean the wafer edge is inside the gas delivery nozzle, such that the gas cannot be independently directed to prevent material from falling onto the good die toward the center of the wafer. Such laser reactions create a cloud of debris and if the gas nozzle is not positioned to remove this cloud away from the center of the wafer, it will re-deposit onto good die causing yield loss. Therefore, the gas nozzle must be independent of the laser beam and directed at some optimized position relative to the substrate to effectively remove the debris away from the center of the wafer. This prior art uses a chamber, which further complicates the process of removing the debris, as it becomes confined in the chamber, and can re-deposit onto the wafer as well as build up on the chamber walls. In a preferred embodiment of the present invention, a vacuum exhaust is used in place of a gas injector to draw the by-products away from the wafer edge eliminating the need for a vacuum chamber. Another problem with this prior art method is that the gas used is inert, and therefore does not permit reaction with films on the wafer edge. Yet another problem with this prior art is that this method shows cleaning only the top surface. But if a source of this type were redirected to the apex, the reaction by-products would be blown onto the good die at the center of the wafer, causing significant yield loss. Still another problem with this prior art is that it requires an oblique angle of incidence for the laser beam. This introduces several problems including beam distortion and focusing issues at the wafer plane.

Thus there is a need for an improved method and apparatus for cleaning the edges of substrates, such as silicon wafers, which overcomes the aforesaid limitations of the cited prior art. There is also a need for a method and apparatus that does not require the use of solvents, corrosive chemicals, or large volumes of highly purified water. There is also a need for a method and apparatus that prevents process by-products from re-depositing onto usable die. There is a further need for an improved method and apparatus for edge cleaning that can address a wide variety of films, eliminating the need for different systems for each film type. There is also a need for an edge cleaning method and apparatus that can accurately clean all of the edges (top, top bevel, apex, bottom bevel, and bottom) in a single tool, thereby reducing the cost and complexity of the cleaning process. Finally, there is a further need for an edge cleaning method and apparatus that can precisely control (to 1 mm or less) the width of the area being cleaned on the edge of a substrate, in order to increase the die yield and meet future semiconductor manufacturing requirements.

SUMMARY

The present disclosure is in one aspect directed to removal and/or transformation of unwanted films and residues on the edges of surfaces, such as silicon wafers, by directing laser radiation to the top, top bevel, apex, bottom bevel, and bottom (hereinafter 'wafer edges') portions of the substrate, thereby photo-reacting and removing such unwanted films and residues from the substrate into a vacuum exhaust.

One object herein is to provide an edge cleaning apparatus that does not require the use of solvents, corrosive chemicals, or large volumes of highly purified water, and is therefore environmentally friendly. In accordance with a preferred embodiment, the apparatus operates at atmospheric pressure and uses environmentally friendly gases, such as air or benign gas mixtures, and laser radiation, to remove films from wafer edges. There is no need for chemicals, water, or a vacuum chamber.

Another object herein is to prevent process by-products from re-depositing onto usable die. In accordance with a preferred embodiment a laser and optical beam delivery system in conjunction with a vacuum exhaust system removes unwanted films and residues from wafer edges without re-depositing byproducts onto otherwise usable die. The preferred embodiment uses a cylindrical exhaust tube, which envelops the substrate edge, with a longitudinal slot for the substrate and circumferential slots for the laser beam, and a vacuum source to create airflow to carry by-products and film residues away from the reaction zone, preventing any debris from landing elsewhere on the substrate.

Another object herein is to address a wide variety of films, eliminating the need for different systems for each film type. In accordance with a preferred embodiment, an apparatus and method can effectively remove multiple film types, residues, and particles including, but not limited to, photoresist edge beads, photoresist residues, silicon-based polymer films, post-etch polymer residues, multi-layer film stacks, polishing residues, particles, metal films, and dielectric films. This is achieved in a single system by the interaction of the laser radiation with the unwanted films, residues, or particles and surrounding gas.

Another object is to accurately clean all of the wafer edges in a single tool with a single dry process, thereby reducing the cost and complexity of the cleaning process. In one embodiment, a method and apparatus removes photoresist edge beads, photoresist residues, silicon-based polymer films, post-etch polymer residues, multi-layer film stacks, polishing residues, particles, metal films, and dielectric films with a single tool and a single dry process is provided.

Another object is to precisely control the width of the area being cleaned on the edge of a substrate, in order to increase the number of usable die and meet future semiconductor manufacturing requirements. This is accomplished by the use of a high-accuracy beam deflection system directing a precisely defined laser beam to the wafer edges.

Another object is to sequentially direct a laser beam onto the top, apex, and bottom of a rotating substrate in order to remove unwanted films, by means of photoreaction, in a single tool and in a single process step. A preferred embodiment removes films from all wafer edges in a single tool by the use of an optical beam delivery system to sequentially direct the laser beam to each surface.

Another object is to process an annulus on the edge of a wafer that is wider than the laser beam. A single pre-lens galvanometric scanning mirror is used for this purpose.

Another object is for focusing said laser beam onto each surface scanned, such that the optical path length is equal for top, apex, and bottom surfaces and the beam always remains in focus. The preferred embodiment uses a telecentric f-theta lens followed by an assembly of mirrors with adjustments to insure equal path lengths.

Another object is to rapidly switch between top, apex, and bottom beams, in order to maintain high throughput. In the preferred embodiment, the initial beam path directs the beam onto the substrate top. A mirror that moves parallel to its reflecting surface is used to re-direct the beam onto the substrate apex, or another mirror that also moves parallel to its reflecting surface is used to re-direct the beam onto the substrate bottom.

Another is to provide laser beam metrology in order to ensure accurate and consistent film removal. In the preferred embodiment, provision is made to record, for example with a CCD camera, profiles of the top, apex, and bottom beams during system setup and alignment. For periodic maintenance, the beam can be directed by means of a mirror that moves parallel to its reflecting surface onto a camera that can be permanently mounted in the tool.

Further objects, technologies, and areas of applicability of the method and apparatus will become apparent from the detailed description provided hereinafter. It should be understood that the detailed description and specific examples, while indicating the preferred embodiment of the invention, are intended for the purposes of illustration only and are not intended to limit the scope of the invention, the scope of which is only being defined by the various claims herein.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention. The organization and manner of the structure and operation of preferred embodiments, together with the above and further objects and advantages thereof, may best be understood by reference to the following description taken in conjunction with the accompanying drawings wherein like reference numerals identify the elements in which.

DETAILED DESCRIPTION OF THE ILLUSTRATED EMBODIMENTS

Figure 1A:
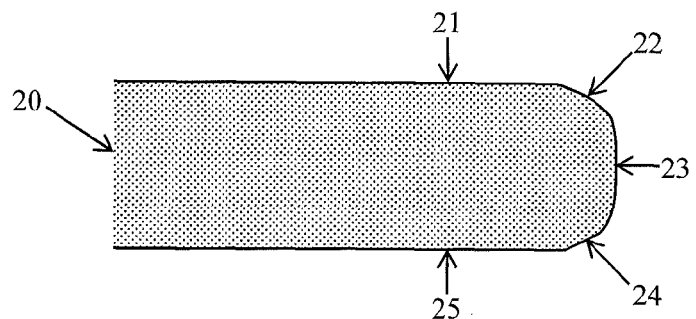
FIG. 1a is a cross-sectional diagram showing of a wafer identifying various surfaces thereof.

A description of example embodiments of the invention follows.

While the invention as recited in the claims presented elsewhere in this document may be susceptible to embodiment in different forms, there is shown in the drawings, and will be described herein in detail, one or more specific embodiments with the understanding that the present disclosure is to be considered but one exemplification of the principles of the invention, and there is no intent to limit the invention to that as illustrated and described herein. Therefore, any references to "the present invention" and "the disclosure" throughout this document are to be interpreted only as a reference to one particular, non-limiting example embodiment of but one aspect of the many inventions described and disclosed in this document.

The disclosure describes an apparatus and methods(s) for removing and/or transforming unwanted films, residues, and particles from the top, top bevel, apex, bottom bevel, and bottom (hereinafter 'wafer edges') of semiconductor substrates, leaving few or no undesirable by-products.

Figure 1B:
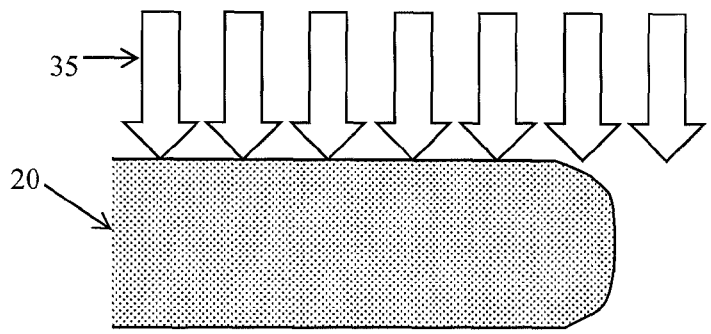
FIG. 1b is a cross-sectional diagram showing a top beam as it scans the top and top bevel of the wafer.
Figure 1C:
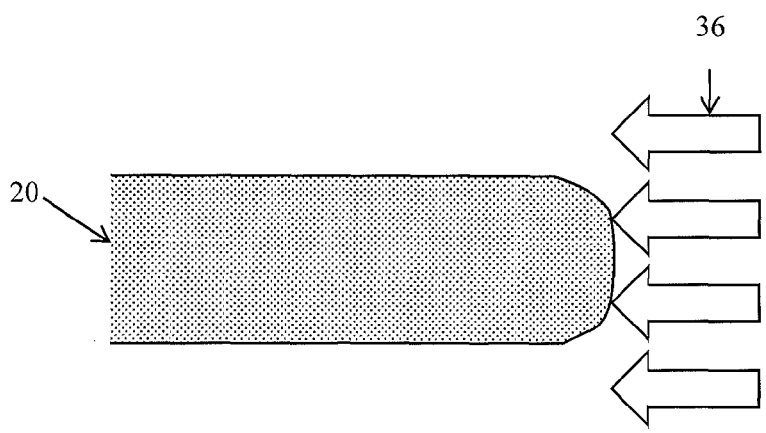
FIG. 1c is a cross-sectional diagram showing an apex beam as it scans the top bevel, apex, and bottom bevel of the wafer.
Figure 1D:
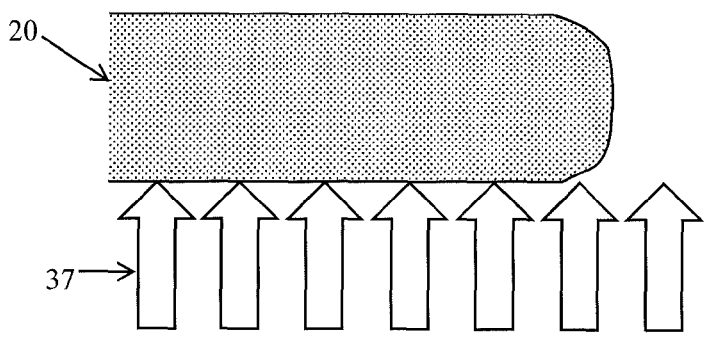
FIG. 1d is a cross-sectional diagram showing a bottom beam as it scans the bottom and bottom bevel of the wafer.

FIG. 1a identifies the edges of the wafer 20 which are referred to in the description that follows. The surfaces that are addressed are the top 21, top bevel 22, apex 23, bottom bevel 24, and bottom 25. FIG. 1b shows the top beam 35 scanning the top 21 and top bevel 22 of the wafer 20. FIG. 1c shows the apex beam 36 scanning the top bevel 22, apex 23, and bottom bevel 24 of the wafer 20. FIG. 1d shows the bottom beam 37 scanning the bottom 25 and bottom bevel 24 of the wafer 20.

Figure 2A:
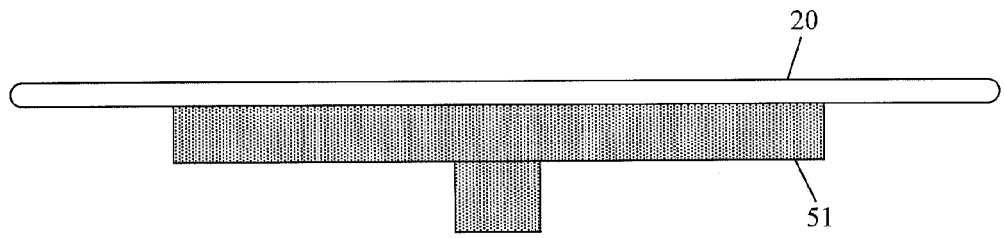
FIG. 2a is a side-elevational view of a semiconductor wafer mounted on a vacuum chuck, prior to being coated with photoresist.
Figure 2B:
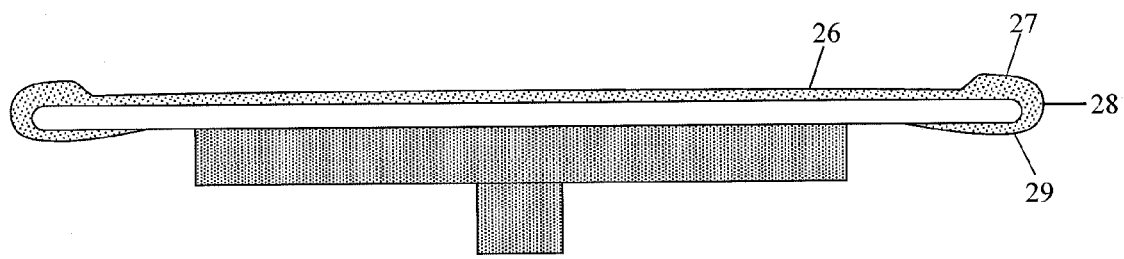
FIG. 2b shows the same wafer as in FIG. 2a, only after being coated with photoresist.
Figure 2C:
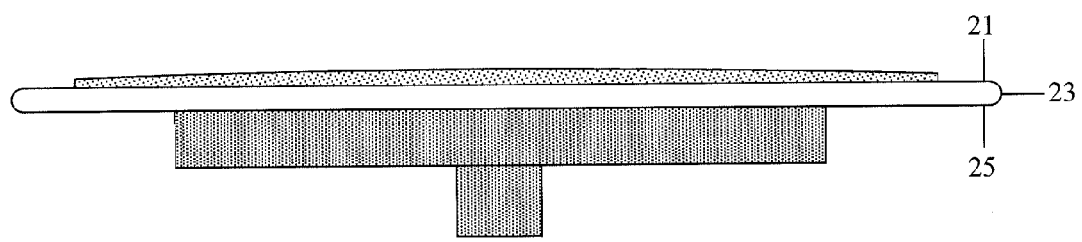
FIG. 2c shows the same semiconductor wafer after the excess photoresist has been removed.

FIGS. 2a, 2b in 2c, in three parts, show how edge bead photoresist problems are created, and solved. FIG. 2a begins with an uncoated semiconductor wafer 20, followed by a wafer coated with photoresist 26 (see FIG. 2b) where the excess photoresist (27, 28, 29) builds up on the wafer edges, creating the problem of edge-beads on the wafer. If this excess photoresist on the edges of the wafer is not removed right away, it will crack and shatter and leave many particles of photoresist on other parts of the wafer and on process equipment, causing multiple defects and loss of device yield in integrated circuit manufacturing. FIG. 2c shows what the wafer looks like after the excess photoresist is removed, by using the method(s) and apparatus(es) described herein. The photoresist has been removed from the top-edge, sidewall, and bottom-edges of the wafer, leaving an even coating of photoresist on the top surface where photolithography steps will be used to form images as part of the integrated circuit fabrication process. Materials other than photoresist, such as photoresist residues, silicon-based polymer films, post-etch polymer residues, multi-layer film stacks, polishing residues, particles, metal films, and dielectric films.

Figure 3:
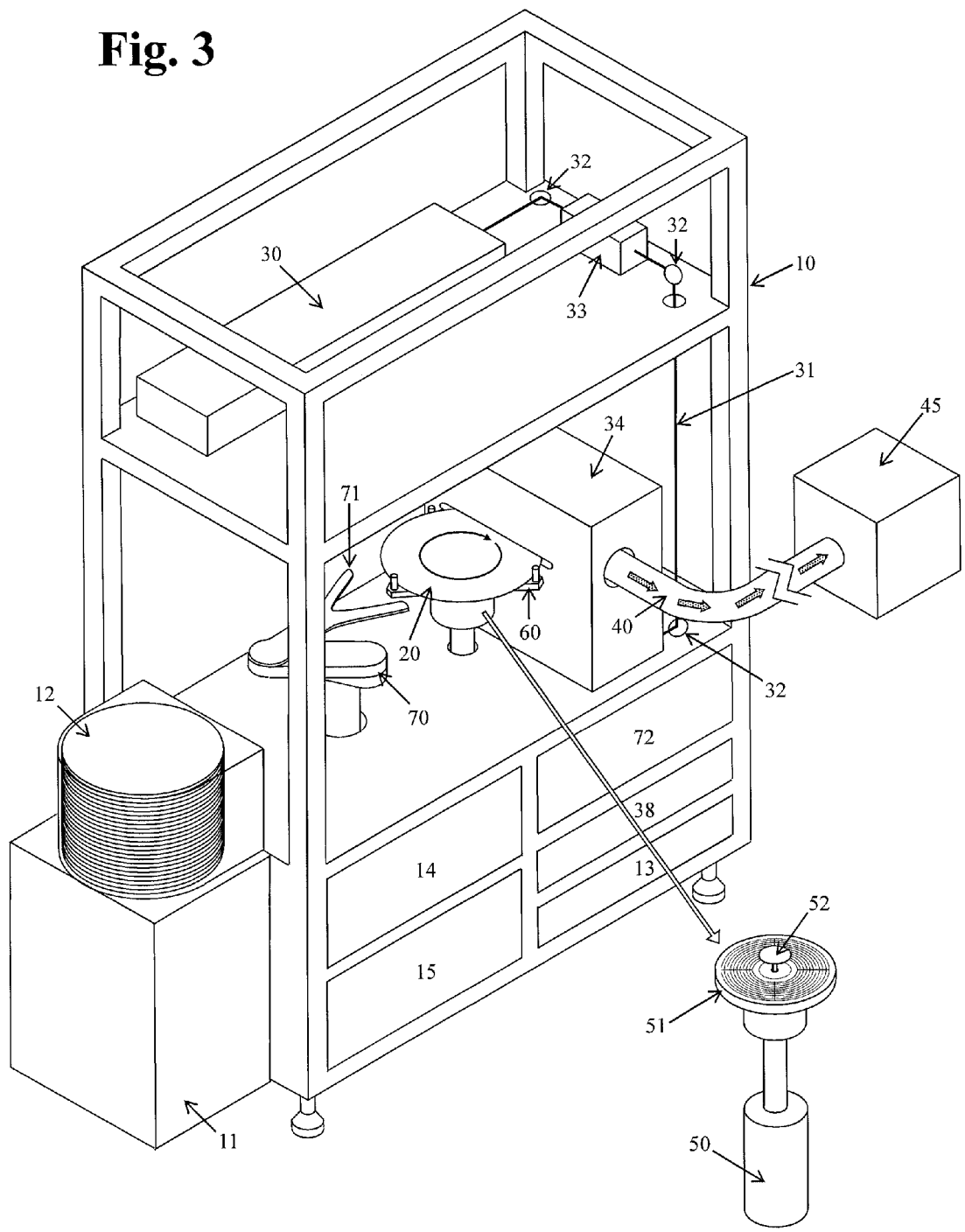
FIG. 3 is an isometric diagram of an edge cleaning system according to an embodiment of the invention.

FIG. 3 illustrates a metal frame and enclosure 10 which houses the components used for the water edge processing system with exception of a load port module (LPM) 11 which is mounted to the outside of the frame 10. In a typical operation the end effector 71 of the robot 70 removes a wafer 20 from the front opening unified pod (FOUP) 12, which is located inside the LPM 11 and positions the wafer 20 over the vacuum chuck 51. When in position, a lifter assembly 52 rises and removes the wafer 20 from the robot end effector 71. The lifter 52 lowers the wafer 20 onto the vacuum chuck 51 and the robot 70 retracts away from the vacuum chuck 51. A servomotor 50 begins to rotate the wafer 20. The robot 70 can be configured as a single arm or a multiple arm design. Multiple arms could result in increased throughput by having the ability to handle more than one wafer simultaneously. The robot controller 72 is located in the lower section of the frame 10. The end effector 71 can be configured with an automatic centering fixture that locates the wafer in exactly the same location every time it is picked up. The LPM 11 holds the FOUP 12 and is controlled by the system software, installed in the system computer 13. The robot 70 retrieves the wafer 20 from the FOUP 12 and locates it over the vacuum chuck 51. When in position, a lifter assembly 52 raises and picks the wafer 20 off of the end effector 71. The lifter 52 is a platform attached to the top of a rod that comes up through the center of the servomotor 50. This platform makes contact with the center of the backside of the wafer 20 and picks it up. Once the robot 70 moves away from the lifter 52, the lifter lowers the wafer 20 onto the vacuum chuck 51. The centering device 60 is closed by means pneumatics controls located on the pneumatics panel 14 and centers the wafer 20 on the vacuum chuck 51. The vacuum chuck 51 holds the wafer 20 with a vacuum source that is fed up through the center of the vacuum chuck 51 and the center of the servomotor 50. The vacuum is distributed across the vacuum chuck 51 via grooves cut into the surface. An exhaust tube 40 slides into place, covering the portion of the wafer 20 where the reaction takes place. The exhaust tube 40 is mounted on a pneumatic slide. The pneumatic slide extends and retracts via compressed air fed in from an external air regulator through pneumatic solenoids, which are mounted on the pneumatics panel 14. The solenoids are controlled by digital I/O modules located on the electrical panel assembly 15 and are controlled by the system computer 13. The servomotor 50 then spins the wafer 20 up to the proper velocity. The servomotor 50 is controlled by the system computer 13 and has programmable parameters such as ramp speeds, acceleration, deceleration, velocity, and rotation time.

The edge cleaning system utilizes a laser 30, which emits radiation in the form of a laser beam 31. The laser power supply 38 is located in the lower section of the frame 10. The beam is passed through beam shaping optics 33 and is reflected by mirrors 32 into the orthogonal tri-beam (OTB) beam delivery assembly 34. The OTB assembly 34 is an optical assembly that directs the laser beam 31 sequentially to any or all of the top, bottom, and apex of the wafer 20, in any order, to an accuracy of better than 0.1 mm. The beam shaping optics 33 are used to modify the size, shape and focus parameters of the laser beam 31 before it enters the OTB assembly 34.

Figure 4A:
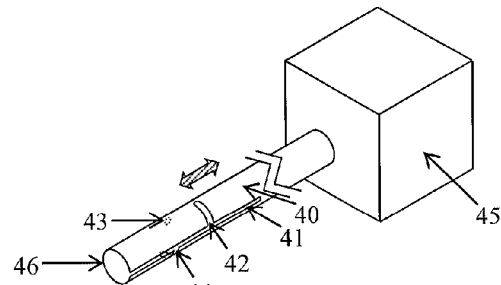
FIG. 4a is an isometric view of the wafer and exhaust system showing an exhaust tube retracted for wafer loading.
Figure 4B:
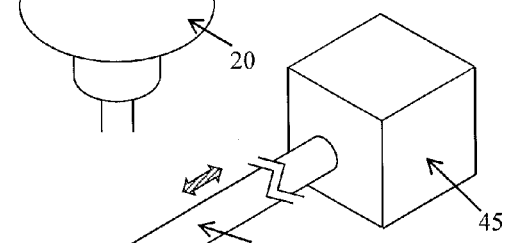
FIG. 4b is an isometric view of the wafer and exhaust system showing the beam directed to the bottom of the wafer.
Figure 4C:
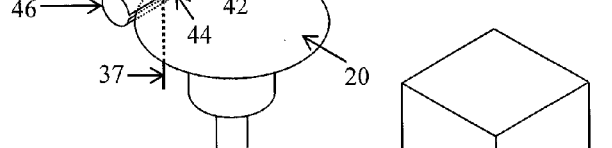
FIG. 4c is an isometric view of the wafer and exhaust system showing the beam directed to the apex of the wafer.
Figure 4D:
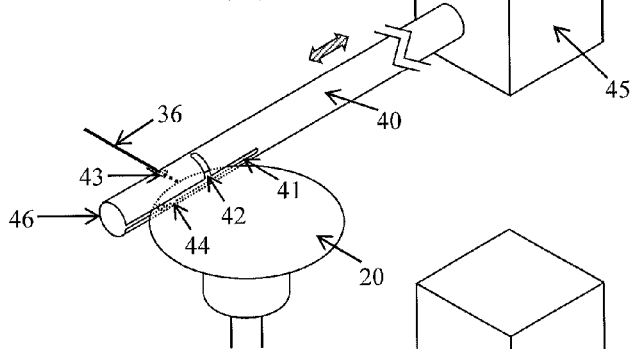
FIG. 4d is an isometric view of the wafer and exhaust system showing the beam directed to the top of the wafer.

An exhaust system as shown in FIGS. 4a to 4e carries unwanted by-products away from the reaction site and away from the wafer. The rotating wafer 20 passes through a slot 41 in the side of exhaust tube 40. An external exhaust source 45 draws ambient gas through the slot, thus removing unwanted by-products. In FIG. 4a the exhaust tube 40 is moved away from the wafer 20 so that the robot 70 can load or unload the wafer to or from the vacuum chuck 51. In FIG. 4d the exhaust tube 40 moves into position so that slot 42 is aligned with the top laser beam 35, which is directed through the slot 42 to the top of wafer 20. In FIG. 4c the exhaust tube 40 moves into position so that hole 43 is aligned with the apex laser beam 36, which is directed through the hole 43 to the apex of wafer 20. In FIG. 4b the exhaust tube 40 moves into position so that slot 44 is aligned with the bottom laser beam 37, which is directed through the slot 44 to the bottom of wafer 20. The top slot 42, the apex hole 43, and the bottom slot 44 are offset from each other to prevent the beam from passing directly through the exhaust tube 40 and out the opposite side as the beam scans off the edge of the wafer.

Figure 4E:
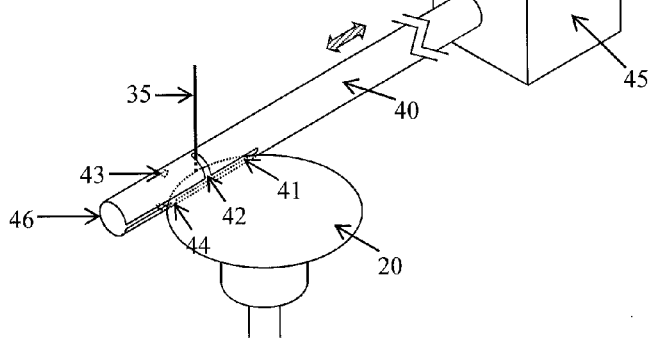
FIG. 4e is a front view showing examples of exhaust baffles.
Figure 4E:
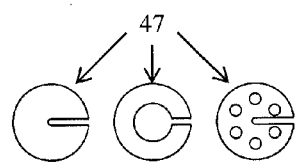

FIG. 4e shows optional baffle plates 47, any one of which may be affixed to the end 46 of the exhaust tube 40 to control the direction and volume of gas flow. The ability to increase or decrease the direction and volume of gas may be desirable in certain applications. The more the flow is blocked with the baffle, the more the flow direction is changed from circumferential to radial with respect to the wafer. An example of an exhaust flow rate without a baffle is 120 liters per second with a velocity of 60 meters per second in a preferred embodiment. In yet another example of an embodiment, changing the spin direction to oppose the direction of the exhaust flow may increase the relative flow velocity at the wafer surface thereby increasing the performance of the exhaust system.

Figure 5A:
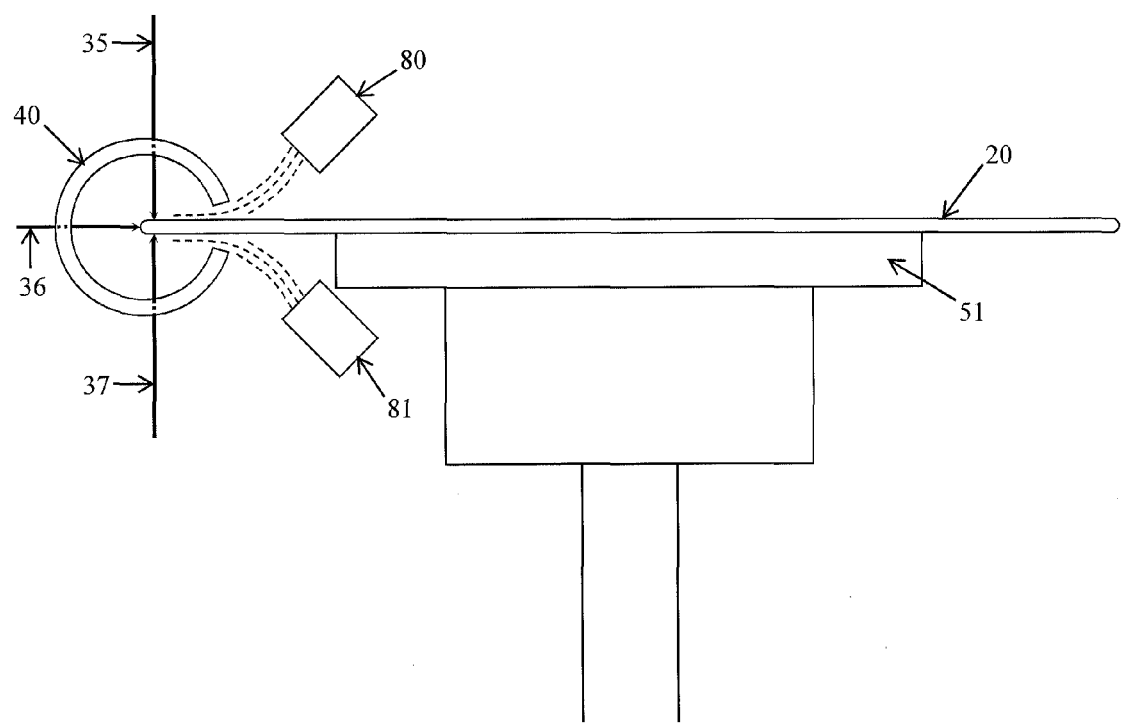
FIG. 5a is a side view of an optional gas injection system of the edge cleaning system.
Figure 5B:
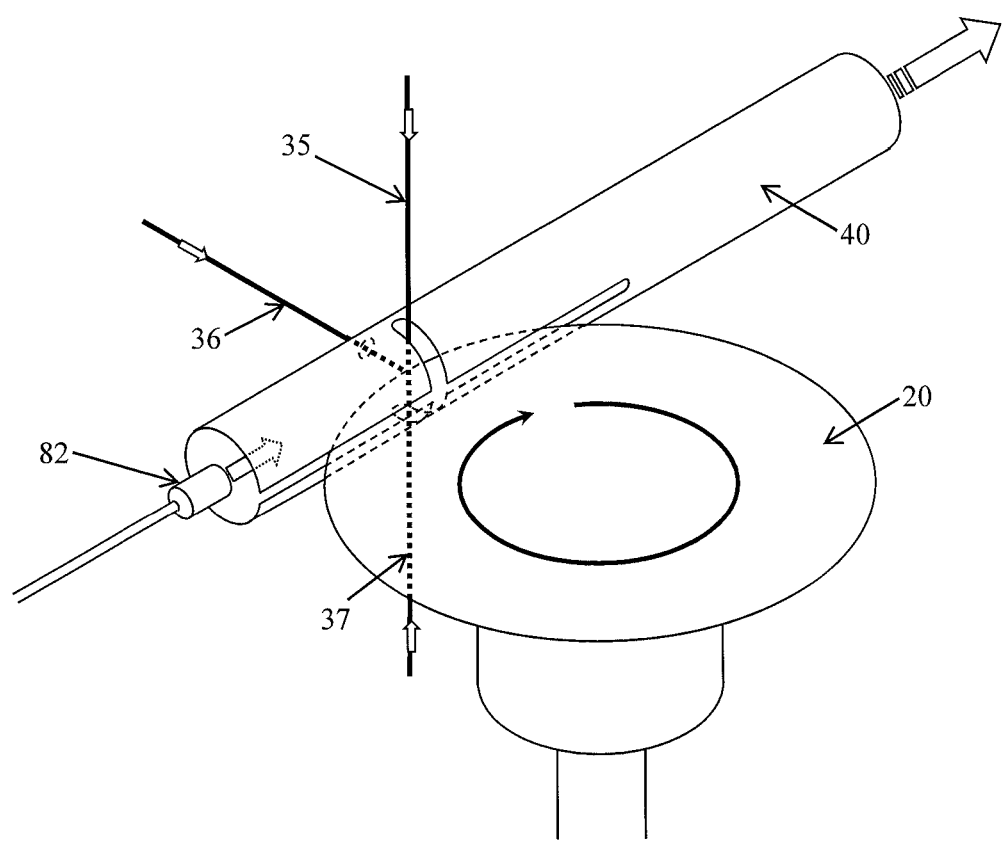
FIG. 5b is an isometric view of a second configuration of an optional gas injection system of the edge cleaning.
Figure 5C:
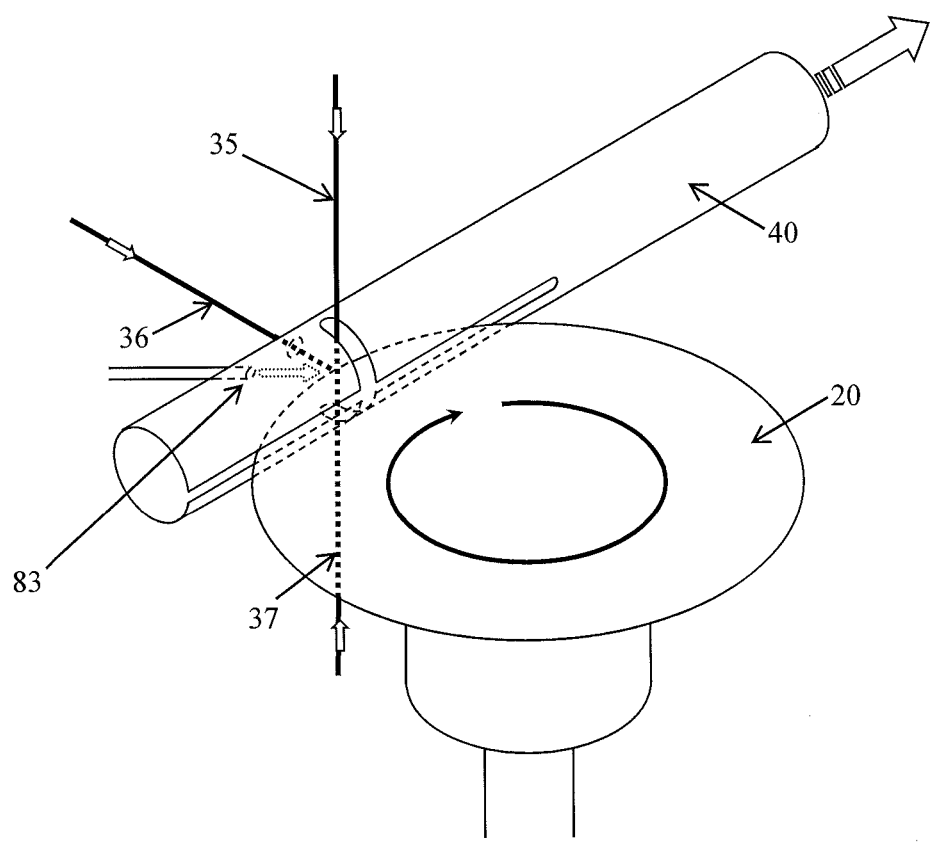
FIG. 5c is an isometric view of a third configuration of an optional gas injection system of the edge cleaning system.

An optional gas injection system shown in FIGS. 5a, 5b, and 5c aids in the reaction between the laser and the material being removed.

Such injected gas may be beneficial in processing the unwanted films, residues, or particles. In a preferred embodiment, the injected gas is an oxidizing gas. Reducing gases such as hydrogen are also effective in removing photoresist. In another embodiment, the injection of hydrogen may also be used to prevent the formation of an oxide layer. The gas injection system may also aid in the removal of unwanted by-products.

Gases are fed from an external source into the system. In one embodiment, shown in FIG. 5a, the gas is fed through a gas line to a top injector 80 and/or a bottom injector 81. The angle of the injector assemblies with respect to the wafer surface can be adjusted to optimize the reaction.

In another embodiment of an optional gas injection system, shown in FIG. 5b, the gas is fed from an external source through a gas line to an axial injector 82, at the end of the exhaust tube 40. This configuration eliminates unwanted turbulence at the reaction site caused by interference between the exhaust gas flow and the injected gas flow, thus allowing the possibility of laminar flow across the wafer surface.

In a third embodiment, shown in FIG. 5c, the gas is fed from an external source through a tube 83 attached to an orifice in the side of the exhaust tube 40, such that the gas flow is aimed at the reaction site on the wafer 20. Other configurations combining injected gas and exhaust flow should be obvious to those skilled in the art.

Figure 6A:
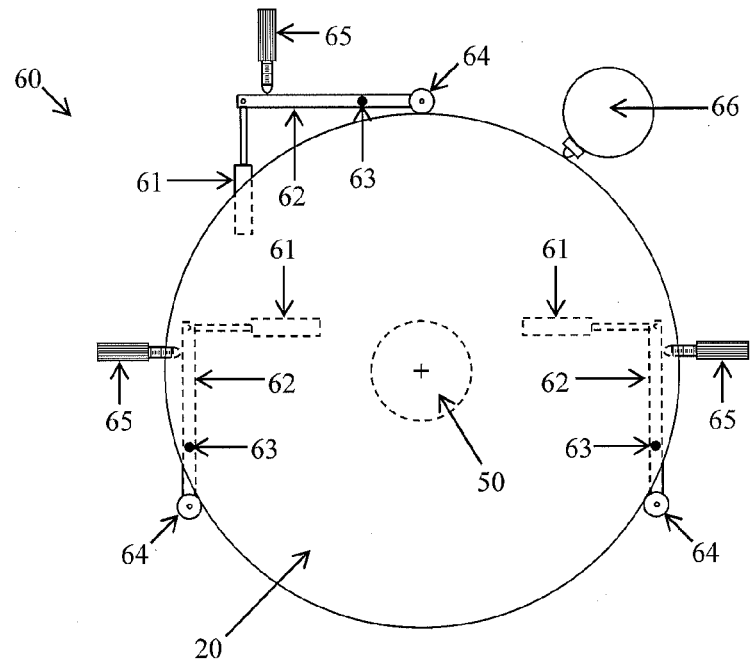
FIG. 6a is a top view of a wafer centering assembly shown in the closed position.
Figure 6B:
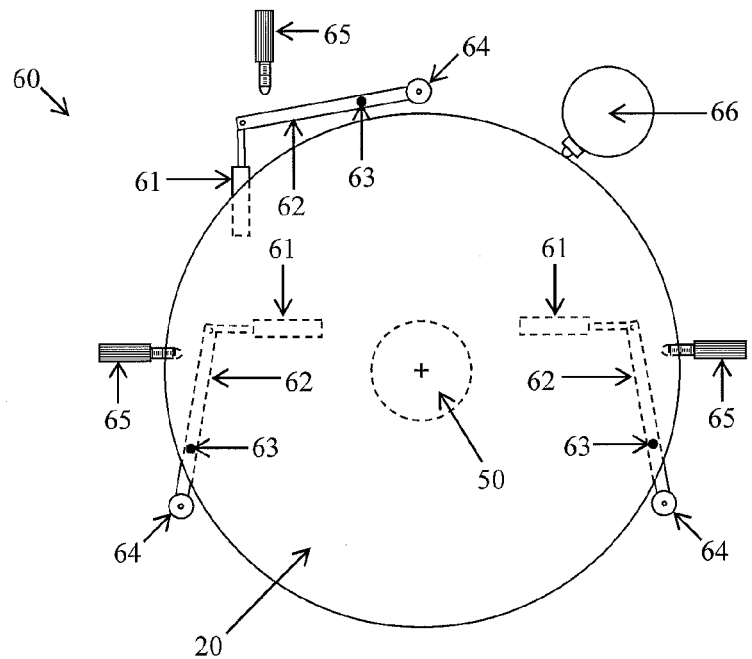
FIG. 6b is a top view of the wafer centering assembly shown in the open position.

One embodiment utilizes a wafer centering assembly 60 shown in FIG. 6a and FIG. 6b, which consists of three contact rollers 64 which make contact with the edges of the wafer 20 at three equally spaced points. In one embodiment, each of the three contact rollers 64 are attached to arms 62 that rotate on a pivot point 63, and are connected to pneumatic cylinders 61 which extend and retract, moving the contact rollers 64 into and away from the wafer's edge. When all three pneumatic cylinders 61 are extended and all three contact rollers 64 touch the wafer, the contact rollers 64 will push the wafer 20 to a point directly over the rotational axis of the servomotor 50. To calibrate the wafer centering assembly 60, a dial indicator 66 or other measurement device is placed at the edge of the wafer 20. If the wafer 20 is not centered, the needle of the dial indicator 66 will move as the wafer 20 is rotated. One, two or all three of the micrometers 65 are adjusted until the needle of the dial indicator 66 remains stationary as the wafer 20 is rotated, indicating that the wafer 20 is centered.

In another embodiment the wafer is centered only to an accuracy sufficient to avoid gross wobble, for example, +/−0.5 mm. This may be accomplished with the robotic wafer loader instead of a centering apparatus. After the wafer is loaded, an image of the wafer edge digitally profiled, for example by capturing it with a digital image recorder. This image then serves as a map used to construct a correction function for the dependence of edge position on wafer rotation angle. During laser edge processing this function is fed to the beam deflection to keep the beam a constant distance from the wafer edge as the wafer rotates. This method also enables the scanning beam to follow the profile of a wafer notch or flat as it rotates. This method reduces the complexity of the machine by eliminating the mechanical alignment apparatus. It may also increase accuracy and throughput.

Figure 7:
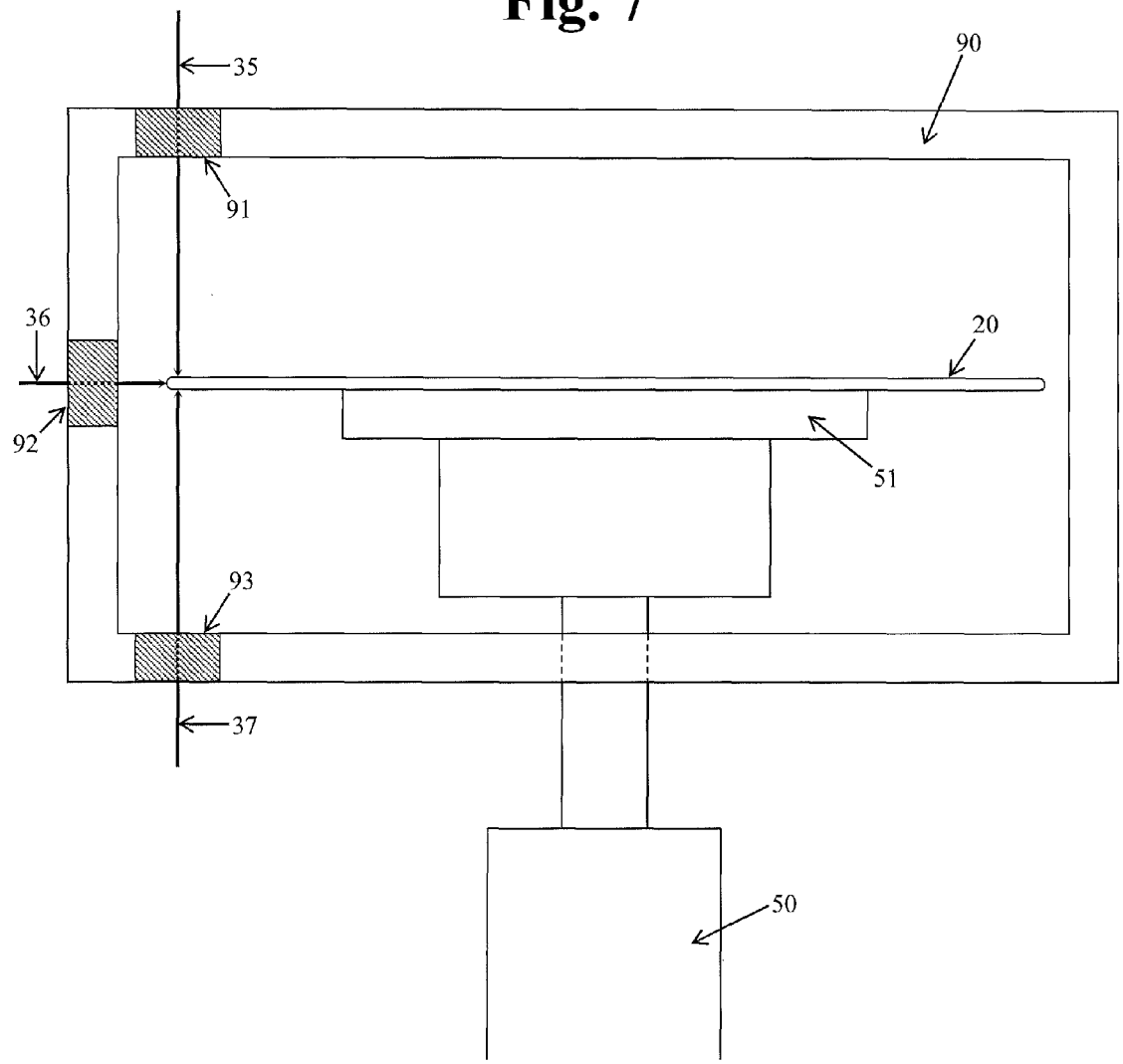
FIG. 7 is a cross-sectional diagram of another embodiment in which the wafer being processed is inside an enclosure.

In another embodiment, the wafer being processed is inside an enclosure such as a vacuum chamber, as shown in FIG. 7. In this embodiment a chamber 90 encloses the wafer 20 and the vacuum chuck 51. The top beam 35 reaches the wafer 20 through a window 91. Similarly, the apex beam 36 reaches the wafer 20 through a window 92, and the bottom beam 37 reaches the wafer 20 through a window 93. This configuration permits the use of corrosive or hazardous gases such as $CF_4O_2$, HF, or $CCl_4$, to remove photoresist and other organic residues, silicon-based resists or inorganic residues, or metal films, respectively.

Figure 8A:
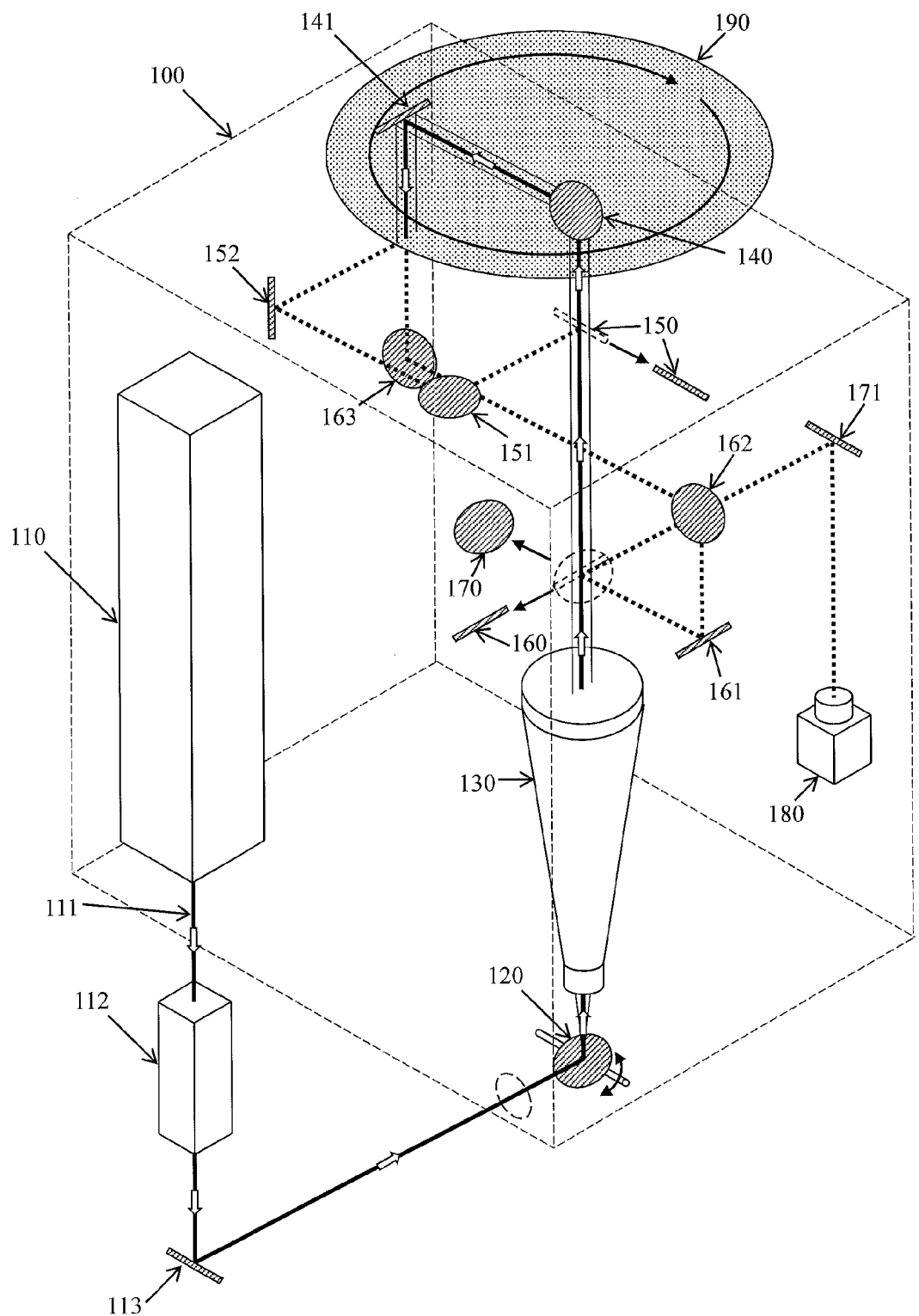
FIG. 8a is an isometric drawing showing how the mirrors are configured so that the laser beam is directed toward the top surface of the rotating wafer.
Figure 8B:
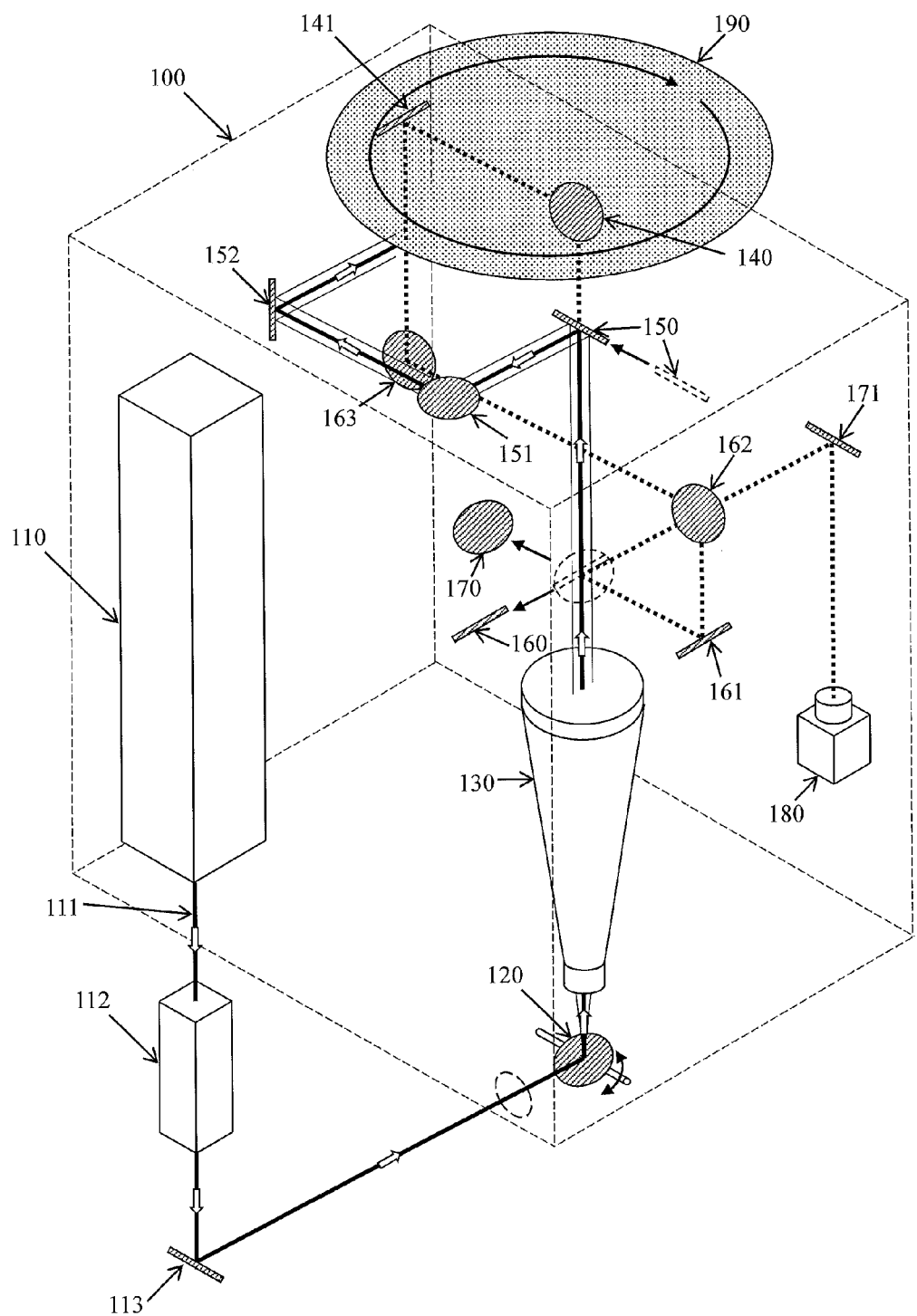
FIG. 8b is an isometric drawing where the mirrors are configured so that the laser beam is directed toward the apex of the rotating wafer.
Figure 8C:
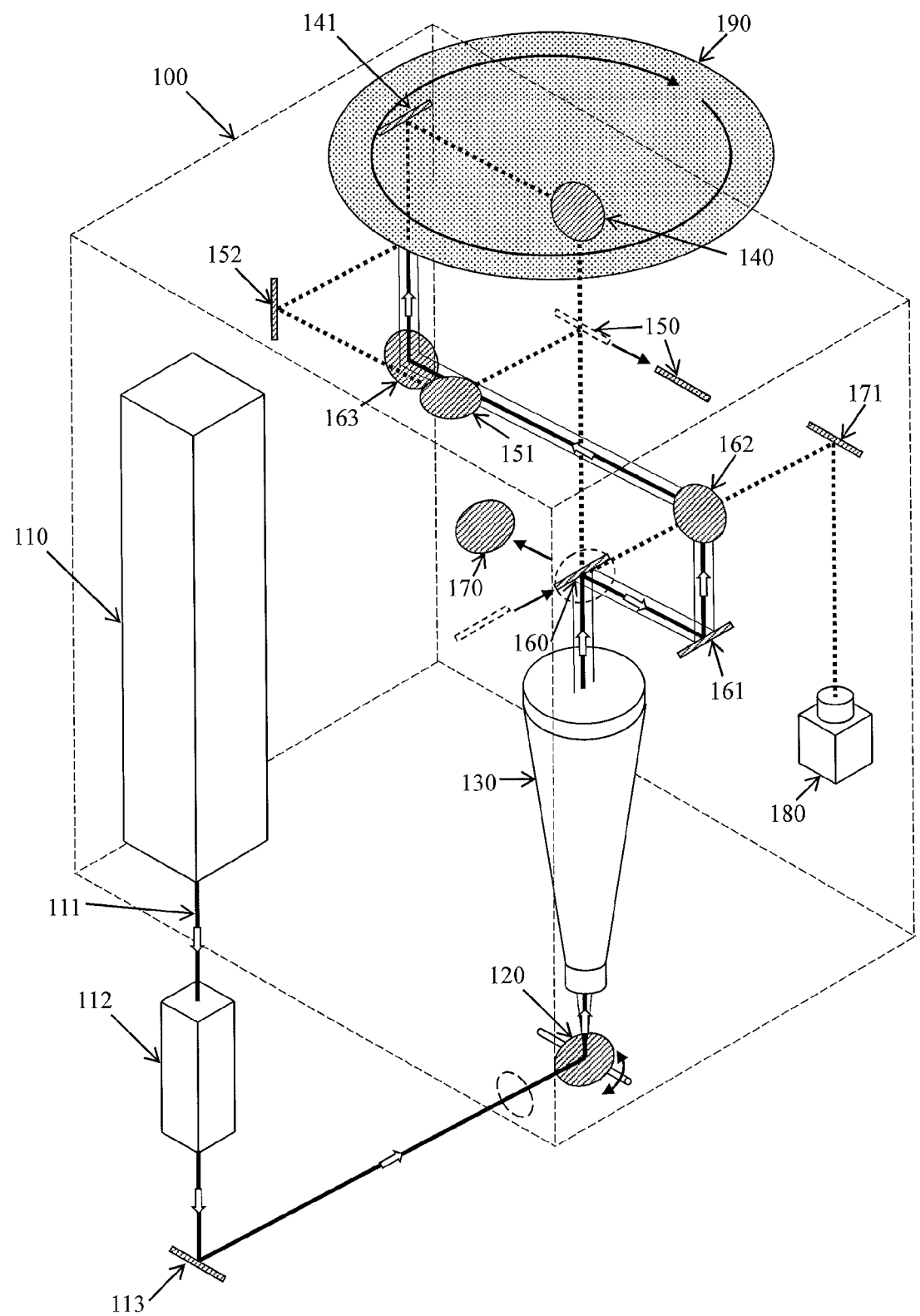
FIG. 8c is an isometric drawing where the mirrors are configured so that the laser beam is directed toward the bottom surface of the rotating wafer.
Figure 8D:
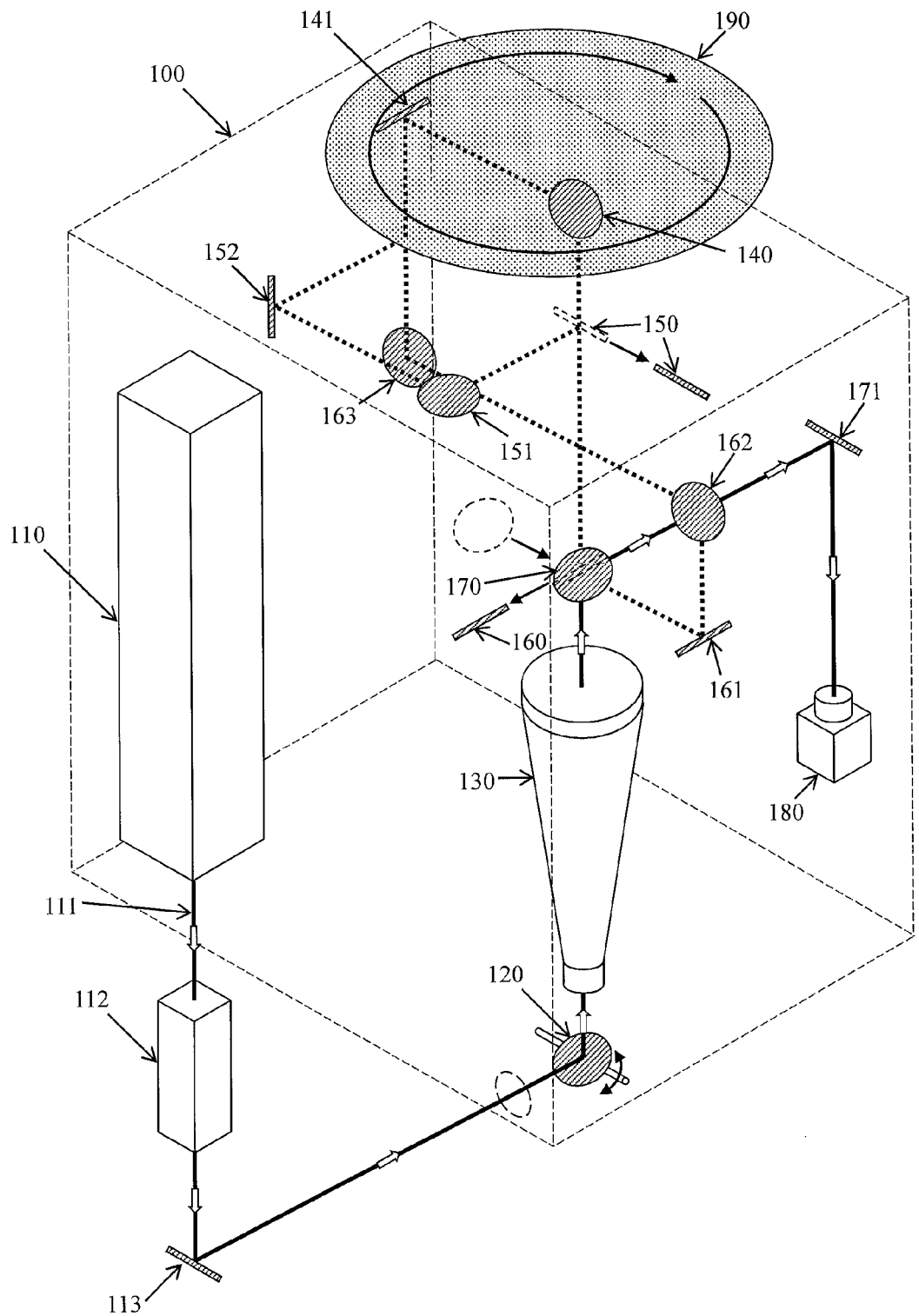
FIG. 8d is an isometric drawing where the mirrors are configured so that the beam is directed toward a camera.
Figure 9:
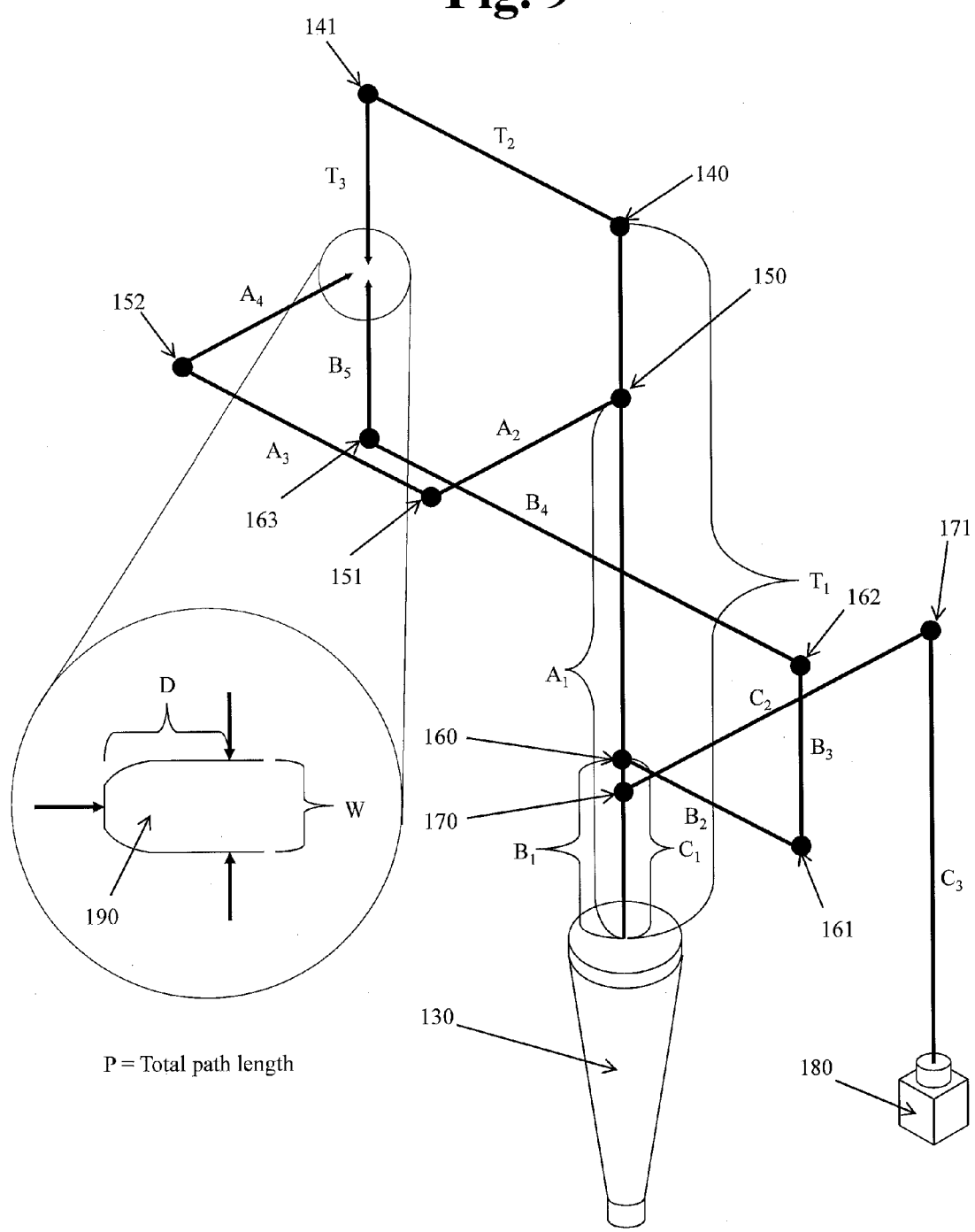
FIG. 9 defines the top, apex, and bottom beam path length segments. This figure also defines the thickness of the wafer and the offset from the wafer edge of the top and bottom beams.
Figure 10:
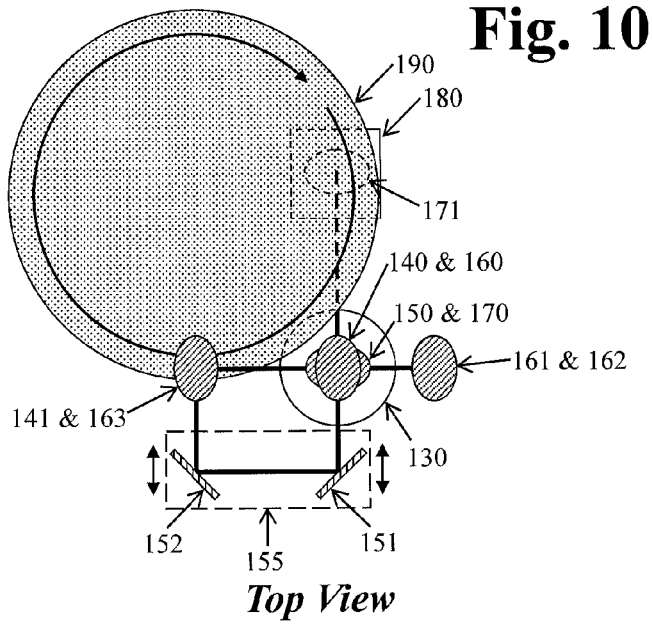
FIG. 10 is a top, front, and side view of the mirror configuration. This figure is shown with all movable mirrors in place and the laser beam taking all possible paths. This figure also shows which sets of mirrors move together on stages to fine-tune the length of each beam path.
Figure 10:
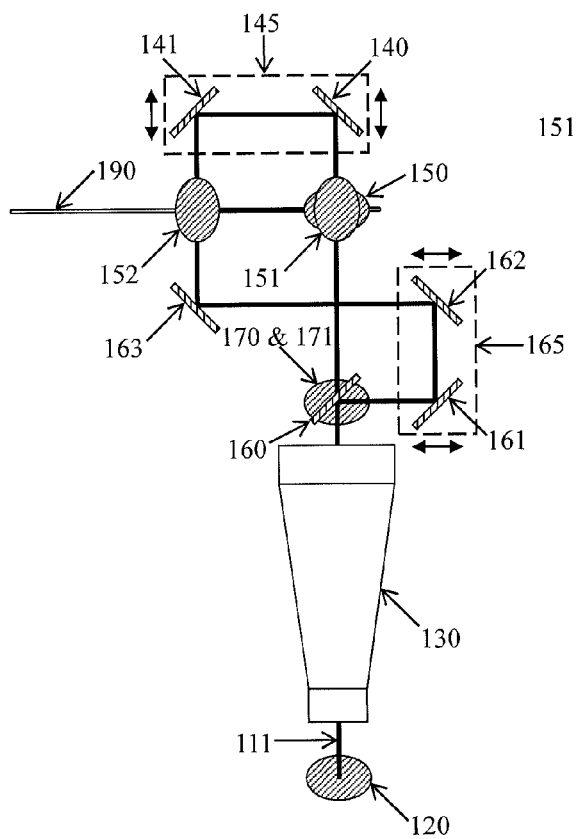
Figure 10:
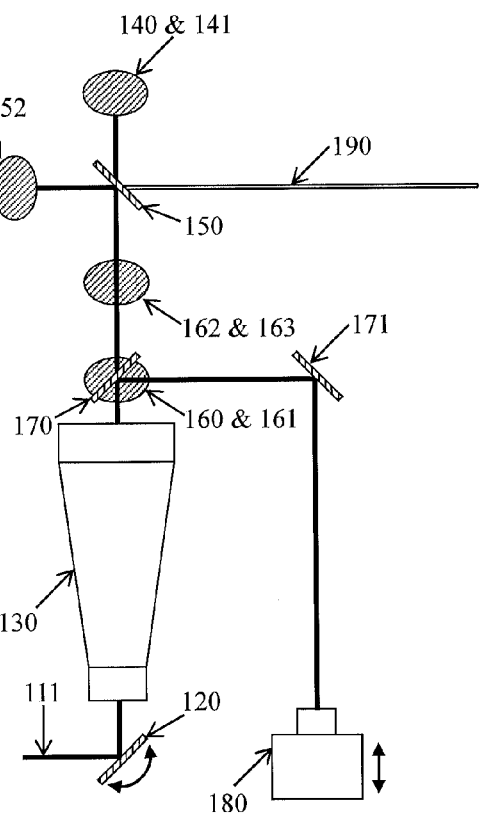

FIGS. 8-10 show the beam paths and other details of the orthogonal tri-beam (OTB) beam delivery assembly 34.

Referring to FIG. 8a, a laser beam 111 exits the laser 110, is shaped by beam shaping optics 112, and directed by bending mirrors such as 113 into the Orthogonal Tri Beam (OTB) box 100. When the laser beam enters the OTB box it reflects off a galvanometric scan mirror 120 which is used to steer the beam into a telecentric scan lens 130 which simultaneously provides f-theta properties such that the angle of the scan mirror is proportional to the distance moved on the wafer 190, corrects the beam exit angle so that it is normal to the wafer 190, and focuses the beam on the wafer plane.

In FIG. 8a the mirrors are shown in a configuration that directs the beam 111 so that it scans the top surface of the wafer 190. The beam exits the telecentric scan lens 130 and travels up until it is deflected laterally by mirror 140, then down by mirror 141 onto the rotating wafer 190. The small lines on either side of the main beam show the beam with the scan mirror 120 at either extreme. FIG. 1b shows a magnified view of the top beam 35 scanning across the top 21 and top bevel 22 of the wafer 20 in a radial direction.

In FIG. 8b moving mirror 150 has been moved into the beam path deflecting the beam into the plane of the wafer 190 and over to mirrors 151 and 152, from which it is directed at the apex of the rotating wafer 190. Mirrors 151 and 152 are positioned such that the beam path length is identical to the path length for scanning the wafer top. FIG. 1c shows a magnified view of the apex beam 36 scanning across the top bevel 22, the apex 23, and the bottom bevel 24 of the wafer 20 in an axial direction with respect to the wafer 20.

In FIG. 8c moving mirror 160 has been moved into the beam path deflecting the beam over to mirrors 161, 162, 163, from which it is directed up towards the bottom of the rotating wafer 190. Mirrors 161, 162, 163 are positioned such that the beam path length is identical to the path length for scanning the wafer top. FIG. 1d shows a magnified view of the bottom beam 37 scanning across the bottom 25 and the bottom bevel 24 of the wafer 20 in a radial direction.

In a preferred embodiment, the extra path length needed for the bottom surface of the wafer is achieved by means of mirrors 160, 161, 162, and 163, all of which lie in the same plane. This ensures that the scan direction is always in a plane which is normal to the plane of incidence for each mirror, thereby creating the longest possible scan line for a given mirror diameter. This is not possible for the apex beam because mirror 150 must break this rule in order to direct the beam into the plane of the wafer, normal to the wafer edge.

In FIG. 8d moving mirror 170 has been moved into the beam path deflecting the beam into the plane of the wafer and over to mirror 171, from which the beam is directed to a camera 180, which captures a profile of the beam. Mirrors 170 and 171 and camera 180 are positioned such that the beam path length to the imaging surface of the camera is identical to the path length for scanning the wafer top. In a preferred embodiment of the present invention, mirrors 170 and 171 are partially reflective beam splitters so that the full power beam can be measured without damaging the camera.

In a preferred embodiment, all moving mirrors 150, 160, and 170 will move out of the beam path in a direction parallel to the plane of the mirror. This ensures that as each mirror moves, the location of the beam on the wafer does not change; the beam simply runs off the side of the mirror when the mirror is far enough out of the way. If, on the other hand, the mirror had a component perpendicular to the mirror plane, the beam position on the wafer would shift as the mirror moves, which would cause an error in beam position on the wafer if the mirror does not return to the exact same position every time it is moved into the beam path.

FIG. 9 shows, for a preferred embodiment, the relationships among the path lengths, which are calculated as follows:

The thickness of the rotating wafer 190 is defined as W.

The total path length of the optical system from the exit (top) of the telecentric scan lens 130 to the wafer 190 is defined as P. This path length must be equal to the working distance of the telecentric scan lens 130.

In order to create the longest scan length possible for the top and bottom beam paths, the position of the laser beam 111 on the rotating wafer 190 when the scanning galvanometer 120 is tilted at 45° should be located slightly less than half of the total possible scan length (which is limited by the diameter of all system mirrors) from the edge of the wafer. This distance is defined as D.

The distance from the exit of telecentric scan lens 130 to mirror 140 is defined as T1.

The distance from the exit of telecentric scan lens 130 to mirror 160 is defined as B1.

The distance from mirror 161 to mirror 162 is defined as $B_3$.

The distance from mirror 160 to mirror 161 is defined as $B_2$.

The distance from mirror 141 to the rotating wafer 190 is defined as $T_3$.

The distance from mirror 163 to the rotating wafer 190 is defined as $B_5$.

The distance from mirror 140 to mirror 141 is defined as $T_2$.

The distance from mirror 162 to mirror 163 is defined as $B_4$.

The distance from mirror 152 to the rotating wafer 190 is defined as $A_4$.

The distance from mirror 151 to mirror 152 is defined as $A_3$.

The distance from mirror 150 to mirror 151 is defined as $A_2$.

The distance from the exit of telecentric scan lens 130 to mirror 150 is defined as $A_1$.

The distance from the exit of telecentric scan lens 130 to mirror 170 is defined as $C_1$.

The distance from mirror 170 to mirror 171 is defined as $C_2$.

The distance from mirror 171 to camera 180 is defined as $C_3$.

With independent variables D, W, P, T1, B1, B3, C1, and C2, the following relationships ensure that the top, apex, bottom, and camera optical paths are identical.

$$B_2=(T_1-B_1-B_3)/2$$

$$T_3=B_2-W/2$$

$$B_5=T_3$$

$$A_4=(B_2+T_3-D)/2$$

$$A_2=A_4+D$$

$$A_1=B_1+B_2+B_3$$

$$T_2=P-T_1-T_3$$

$$A_3=T_2$$

$$B_4=T_2+B_2$$

$$C_3=P-C_1-C_2$$

Due to machine tolerances and other possible slight errors in the positions of the system mirrors, the beam paths in the system may not be exactly the same length when the system is assembled. Therefore, in the preferred embodiment of the present invention each possible beam path has an adjustment that fine-tunes that path length without affecting beam position on the wafer 190.

In FIG. 10 mirrors 140 and 141 are shown on moving stage 145 that adjusts the total length of the top beam path, mirrors 151 and 152 are shown on moving stage 155 that adjusts the total length of the apex beam path, and mirrors 161 and 162 are shown on moving stage 165 that adjusts the total length of the bottom beam path. As each stage with two mirrors is moved, the path length of the affected beam path is adjusted by twice the distance that the stage is moved. Camera 180 is also shown as being able to move up and down to adjust camera path length, making all beam paths in the system adjustable.

FIGS. 11-14 show an alternate beam delivery method that employs two angled beams to address all wafer edges.

Figure 11A:
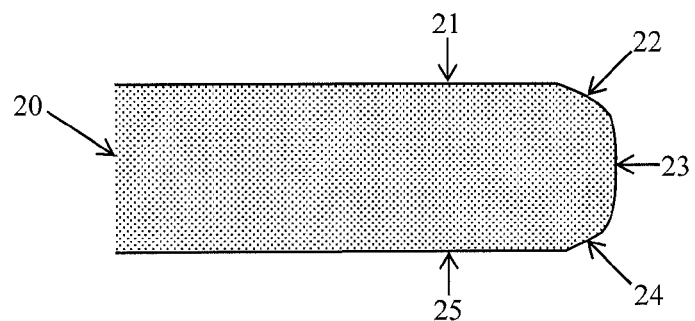
FIG. 11a is a cross-sectional diagram showing a wafer and identifying surfaces thereof.
Figure 11B:
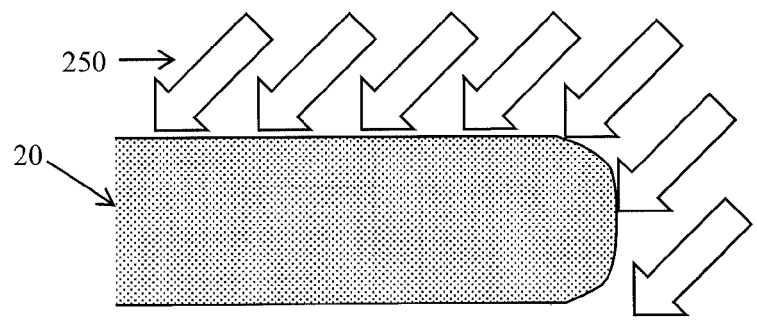
FIG. 11b is a cross-sectional diagram showing the top beam as it scans the top, top bevel, and apex of the wafer.
Figure 11C:
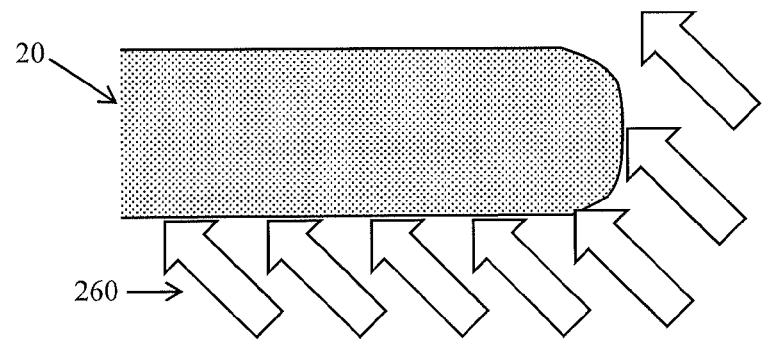
FIG. 11c is a cross-sectional diagram showing the bottom beam as it scans the bottom, bottom bevel, and apex of the wafer.

FIG. 11a identifies the edges of the wafer 20, which are addressed by the present disclosure and are referred to in the specification that follows. The surfaces that are addressed are the top 21, top bevel 22, apex 23, bottom bevel 24, and bottom 25. FIG. 11b shows the top beam 250 scanning the top 21, top bevel 22, and apex 23 of the wafer 20. FIG. 11b shows the bottom beam 260 scanning the bottom 21, bottom bevel 22, and apex 23 of the wafer 20.

Figure 12A:
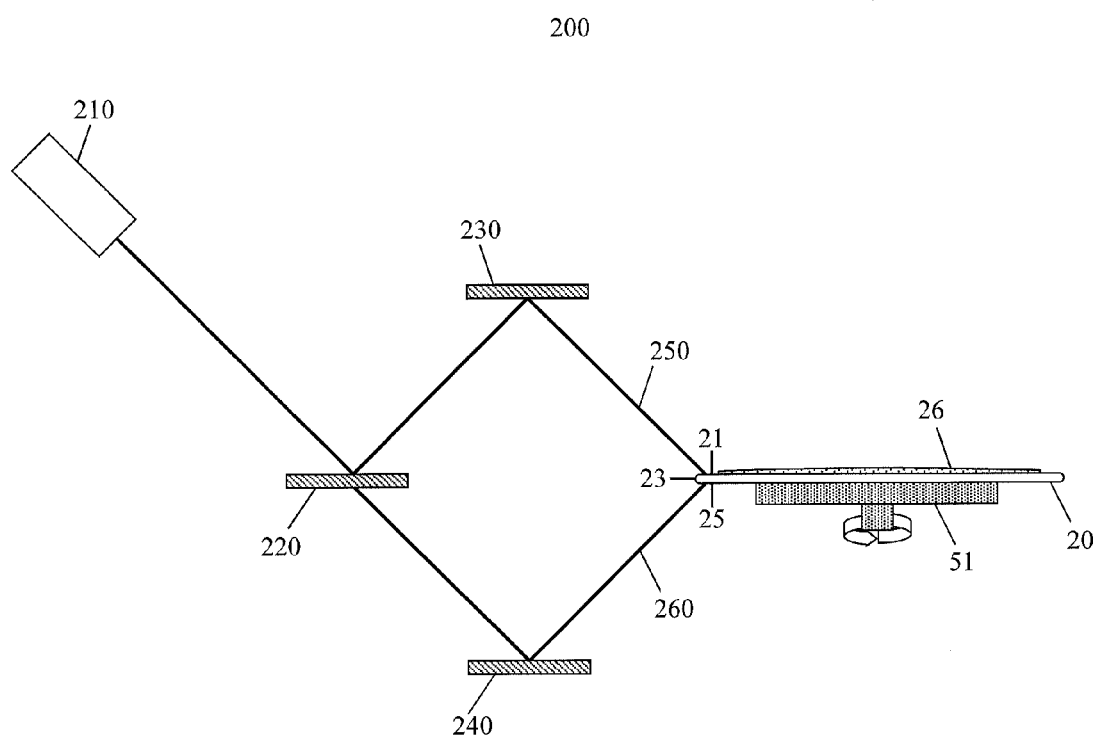
FIG. 12a is a side elevational view of another configuration of a laser optical delivery system.

This embodiment includes a laser optical beam delivery system, which will now be discussed with reference to FIGS. 12a, and 12b. As illustrated in FIG. 12a, the optical system 200 used as part of the apparatus for processing wafer edges includes the laser source 210 which sends a beam of radiation to beam splitter 220, dividing the beam into beams 250 and 260 which are reflected off of mirrors 230 and 240 respectively, in this embodiment. The laser radiation is directed to the top edge 21, the apex 23, and the bottom edge 25. Wafer 20 is rotated on chuck 51 while the laser radiation is directed to the various wafer edges to process material on the top 21, bottom 25, and apex 23 portions of the substrate.

In this embodiment, the split beams each form a 45° degree angle to the wafer plane, so that the split beams are maintained at 90° with respect to each other. This way they arrive at the same incidence angle and therefore the same fluence is delivered to both the top 21 and bottom 25 edges of the wafer 20. However these angles may be adjusted to accommodate variations in the thickness of the material being processed along the top 21 and bottom 25 edges, or for other reasons.

In FIG. 12a, the radial width of the zone of removal on the wafer 20 is limited to the size of the impinging beams 250 and 260. To enable the processing of material that is wider than the impinging beam, and also to enable precise control of the removal zone, a scan head 213, with an f-theta scan lens, has been added to the system, as shown in FIG. 12b. To maintain a flat scan field, the scanning direction is parallel to the beam as it enters the scan head, as shown in FIG. 12b. If the plane of the incoming beams were placed tangent to the wafer ($\Theta=0$ in FIG. 12b, Top View), scanning would be radial and thus ideal but fluence at the wafer apex 23 would be little or none because of grazing angle of incidence. Therefore, in this embodiment, the incoming beams are directed to a point on the wafer edge at a non-zero angle $\Theta$ [Theta], preferably 30° to equalize fluence on the top 21, apex 23, and bottom 25 of the wafer.

To process a larger width of material on the bottom of the wafer than on the top (or vice-versa), either mirror 230 or mirror 240 may be tilted slightly, so that beams 250 and 260 land at a different distance from the wafer edge.

Figure 12B:
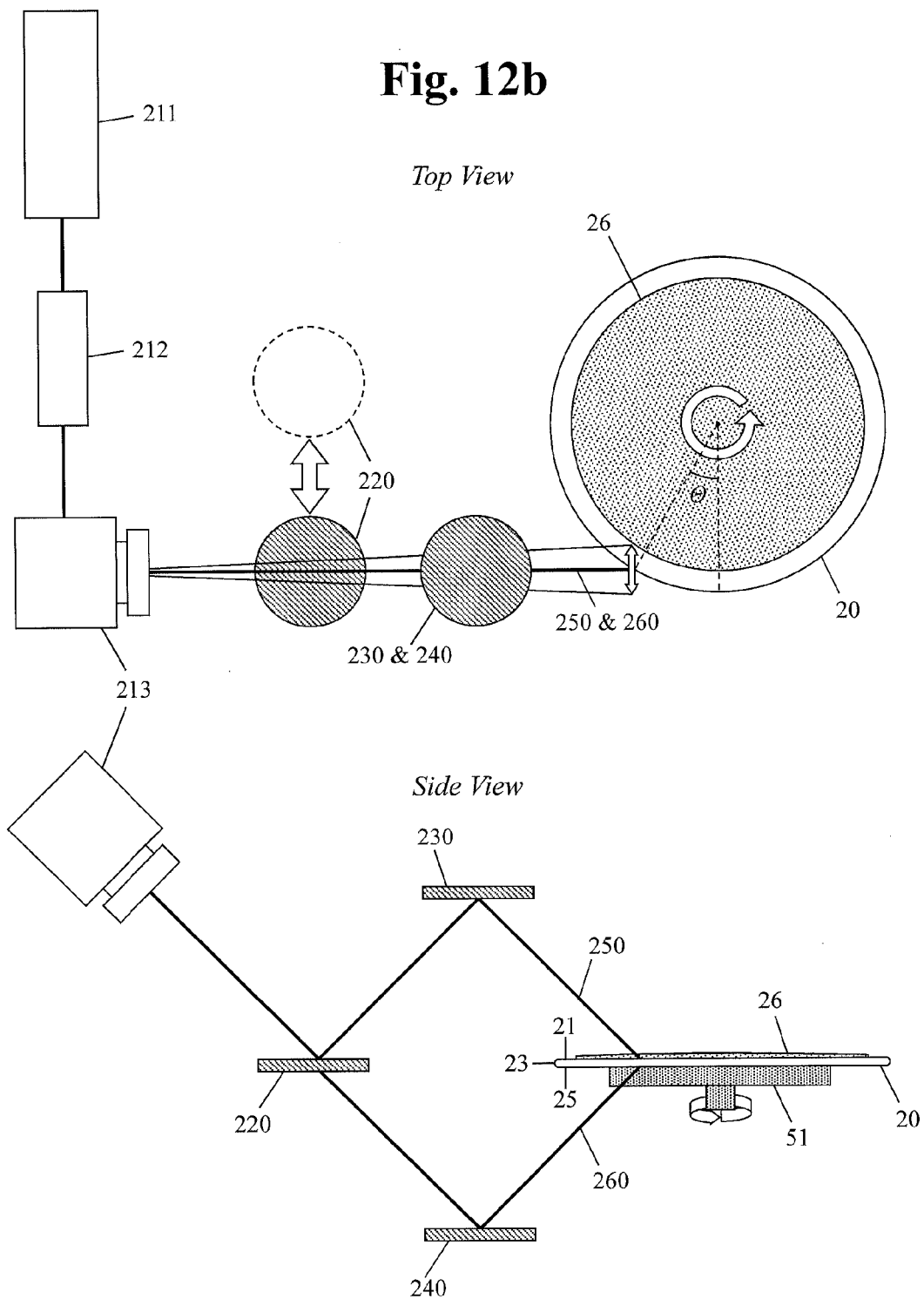
FIG. 12b is a top and side view of another configuration of the laser optical delivery system pictured in FIG. 12a where a scan head has been added to allow the beam to move across the edge of the wafer so that a section of edge bead can be removed that is wider than the laser beam.

Another feature, shown in FIG. 12b, is a moveable reflecting optic 220. If this optic is a 50-50 beamsplitter, equal energy is delivered by beams 250 and 260, and both top 21 and bottom 25, as well as apex 23, receive equal fluence. If only the top 21 requires processing, then replacing said beamsplitter with a 100% reflecting mirror delivers maximum energy to the top surface 21. Alternatively, if only the bottom 25 requires processing, then the optic 220 can be removed and maximum energy is delivered to the bottom surface 25.

Figure 13A:
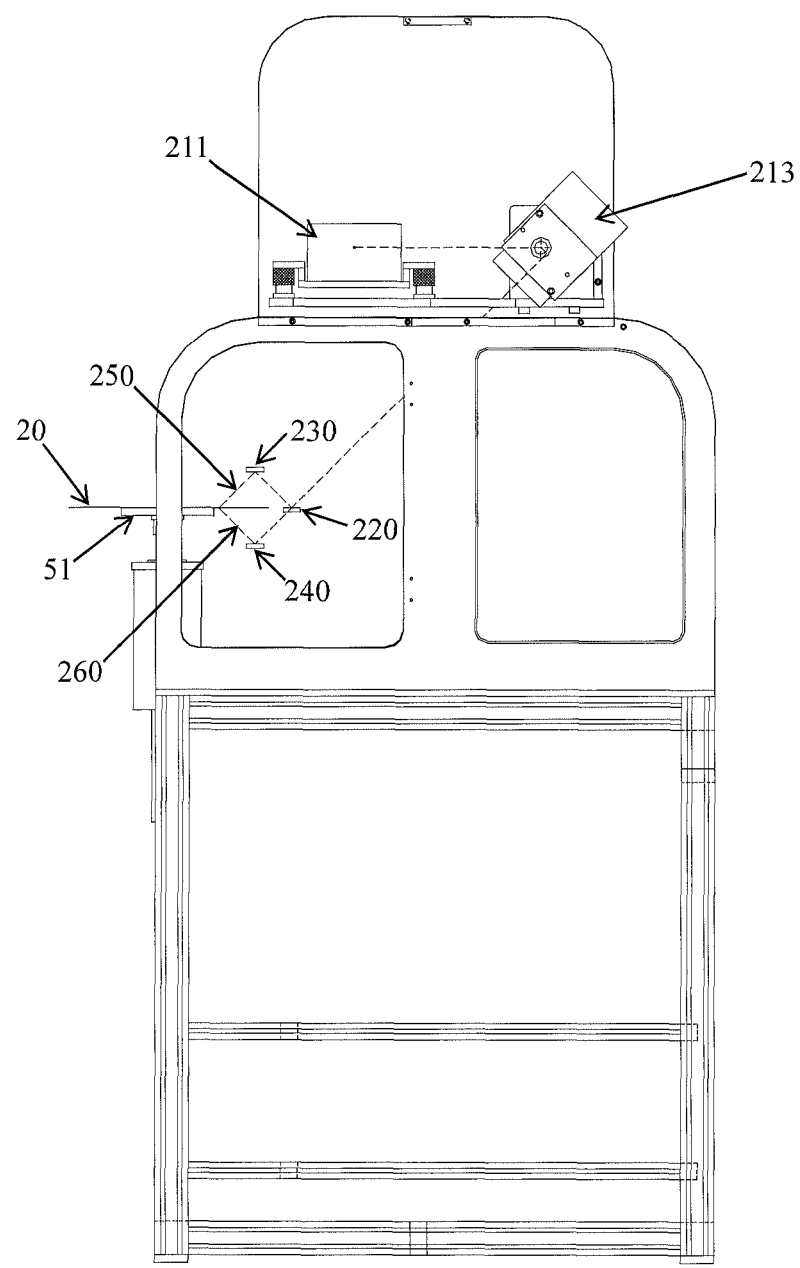
FIGS. 13a, 13b and 13c are detailed front, side and top elevational views of one embodiment of a physical enclosure for the system of FIGS. 12a, 12b and 12c showing the relative placement of the wafer, wafer chuck lifter assembly, laser, optical bridge, scan head, mirrors and beam path.
Figure 13B:
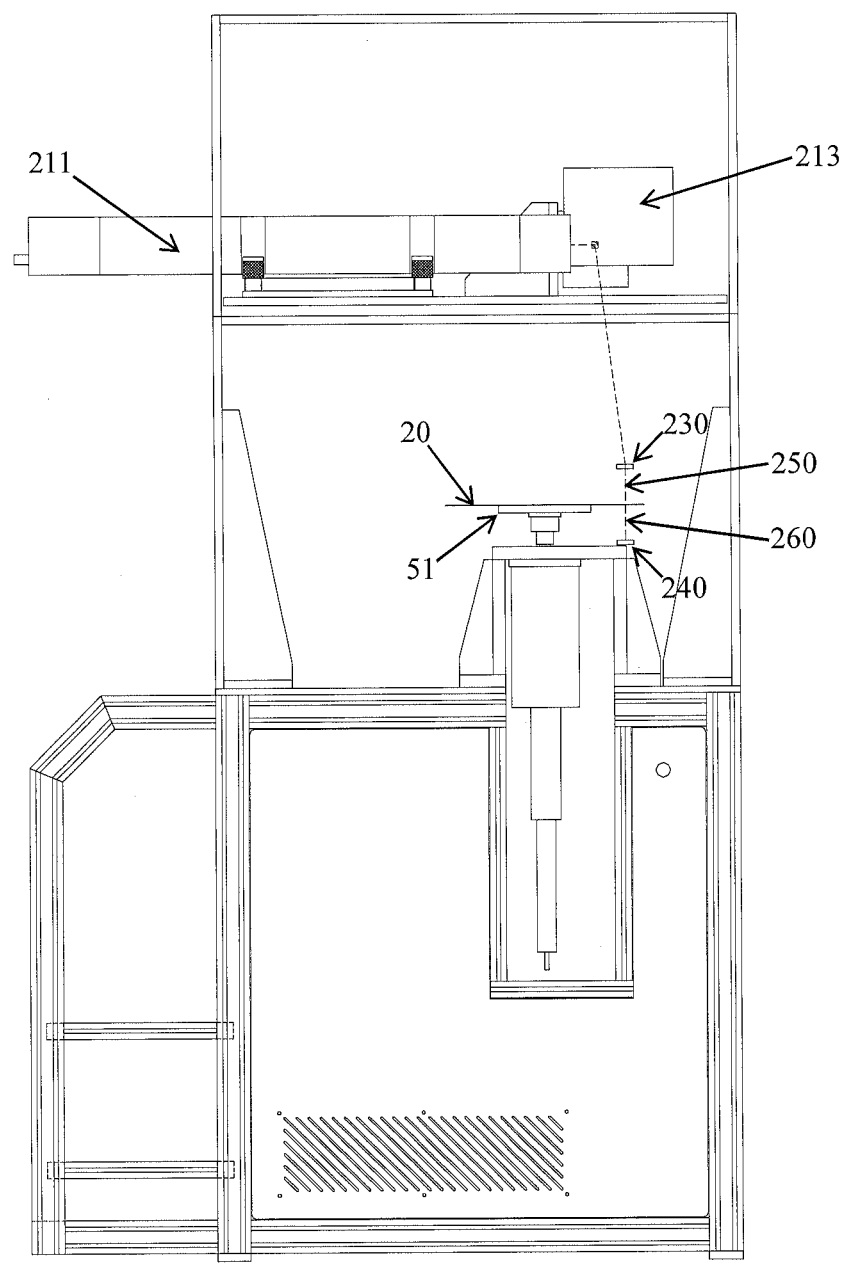
Figure 13C:
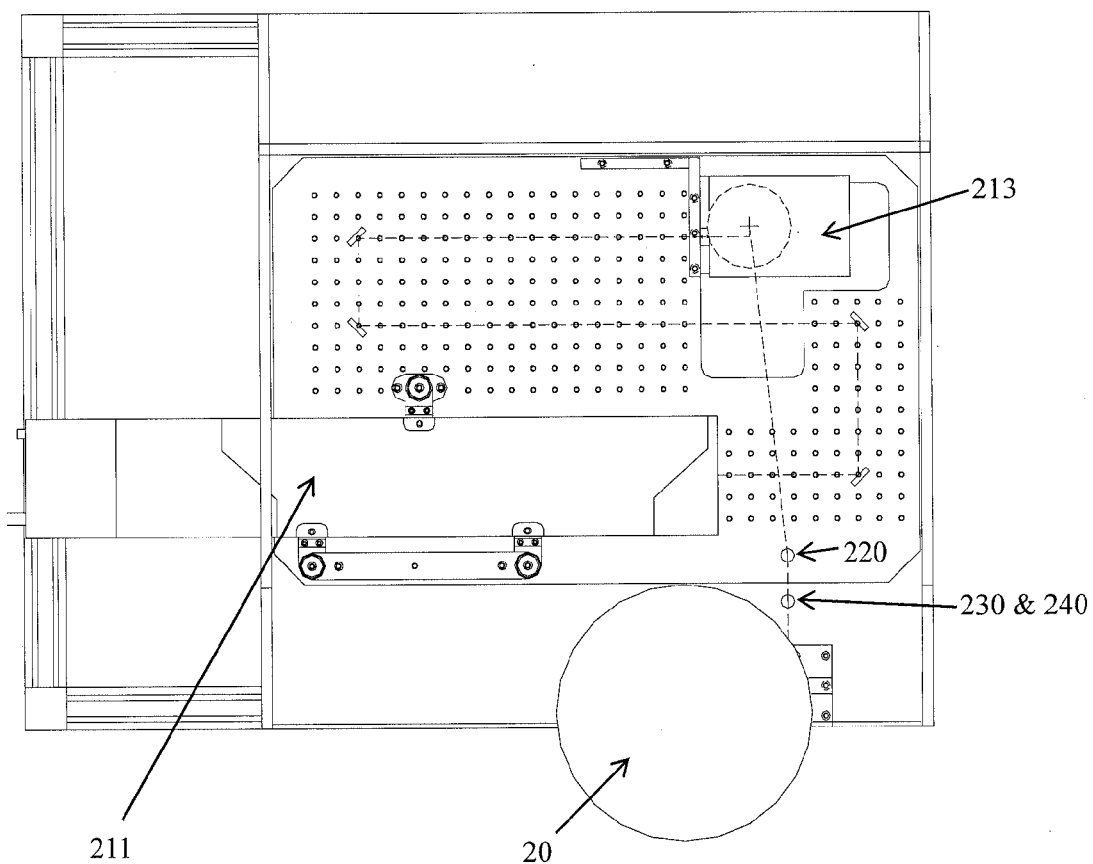

FIGS. 13a, 13b and 13c are detailed front, side and top elevational views of one embodiment of a physical enclosure for the system of FIGS. 12a, and 12b. These views show the relative physical placement of the wafer 20, wafer chuck 51 and associated lifter assembly, laser 211, scan head 213, mirrors 220, 230, 240, beam paths 250, 260 and other components thereof.

Figure 14:
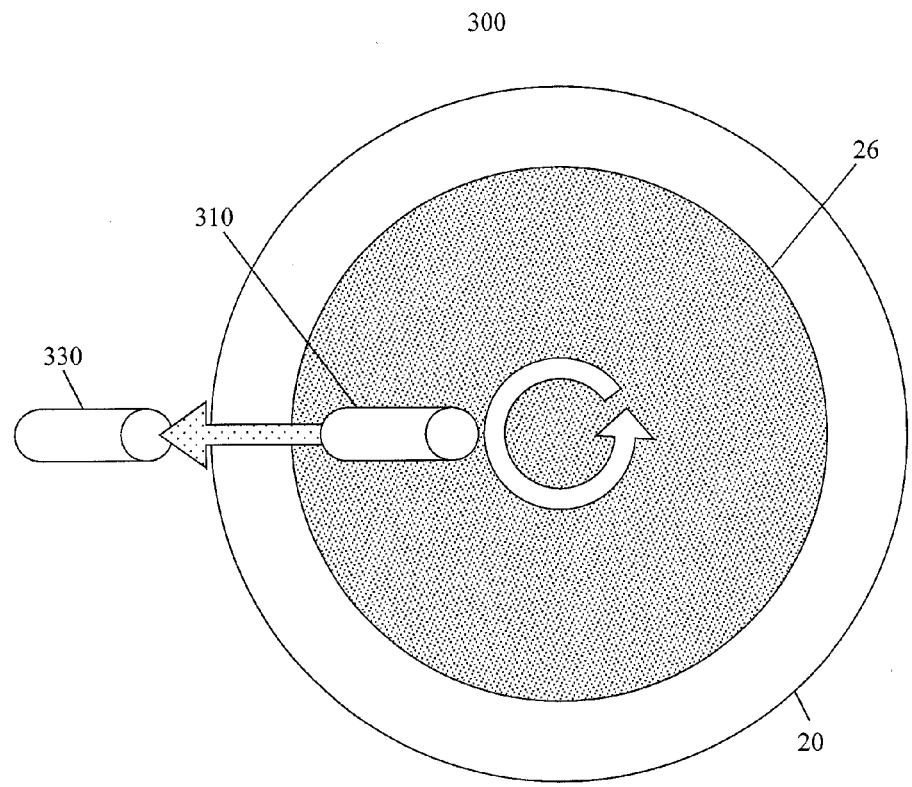
FIGS. 14 shows gas injection and gas exhaust nozzles used in conjunction with the laser optical delivery system of the various systems.
Figure 14:
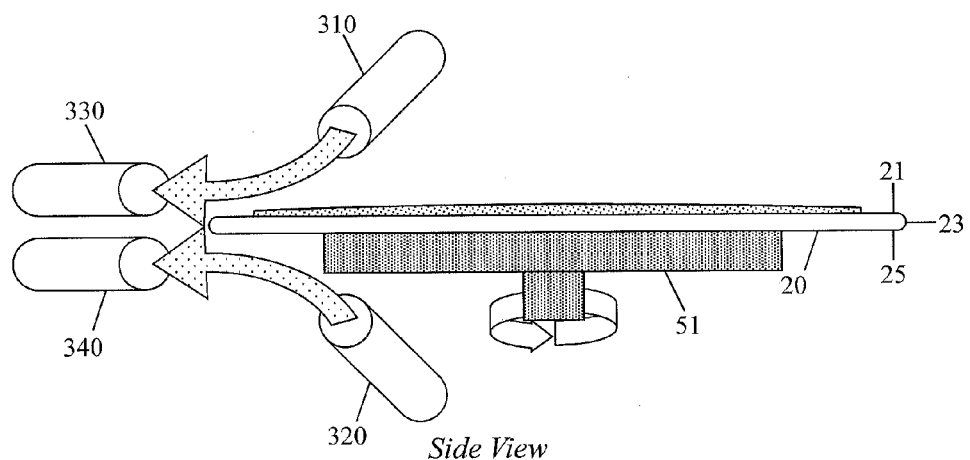

The apparatus includes an exhaust system and an optional gas injection system, as shown in FIG. 14. As illustrated therein, gas injection and exhaust system 300 consists of two injection nozzles and two exhaust nozzles. Injection nozzle 310 delivers gas to the top wafer edge 21 of the wafer 20 as well as some portions of wafer apex 23 since the gas is delivered at an oblique angle and the wafer has a beveled edge of approximately the same angle. Injection nozzle 320 also delivers reactive gas to wafer bottom edge 25 as well as portions of the wafer apex 23. In one embodiment, the reactive gas interacts with a photoresist film that is photoablated by the laser beam creating by-products, which are removed by two exhaust nozzles. Exhaust nozzle 330 is positioned to remove by-products from the reactions occurring on the top edge 21 of the wafer, and exhaust nozzle 340 is positioned to remove by-products from reactions on the bottom edge 25.

In one embodiment, the integration of the laser optical delivery sub-system 200, as illustrated in FIG. 12b, with gas injection and exhaust system 300, as illustrated in FIG. 14, results in a simple system which can remove photoresist from the wafer edges in a single, dry step, eliminating the need for solvents, acids or bases, proprietary photoresist strippers, and large volumes of purified water.

Figure 15A:
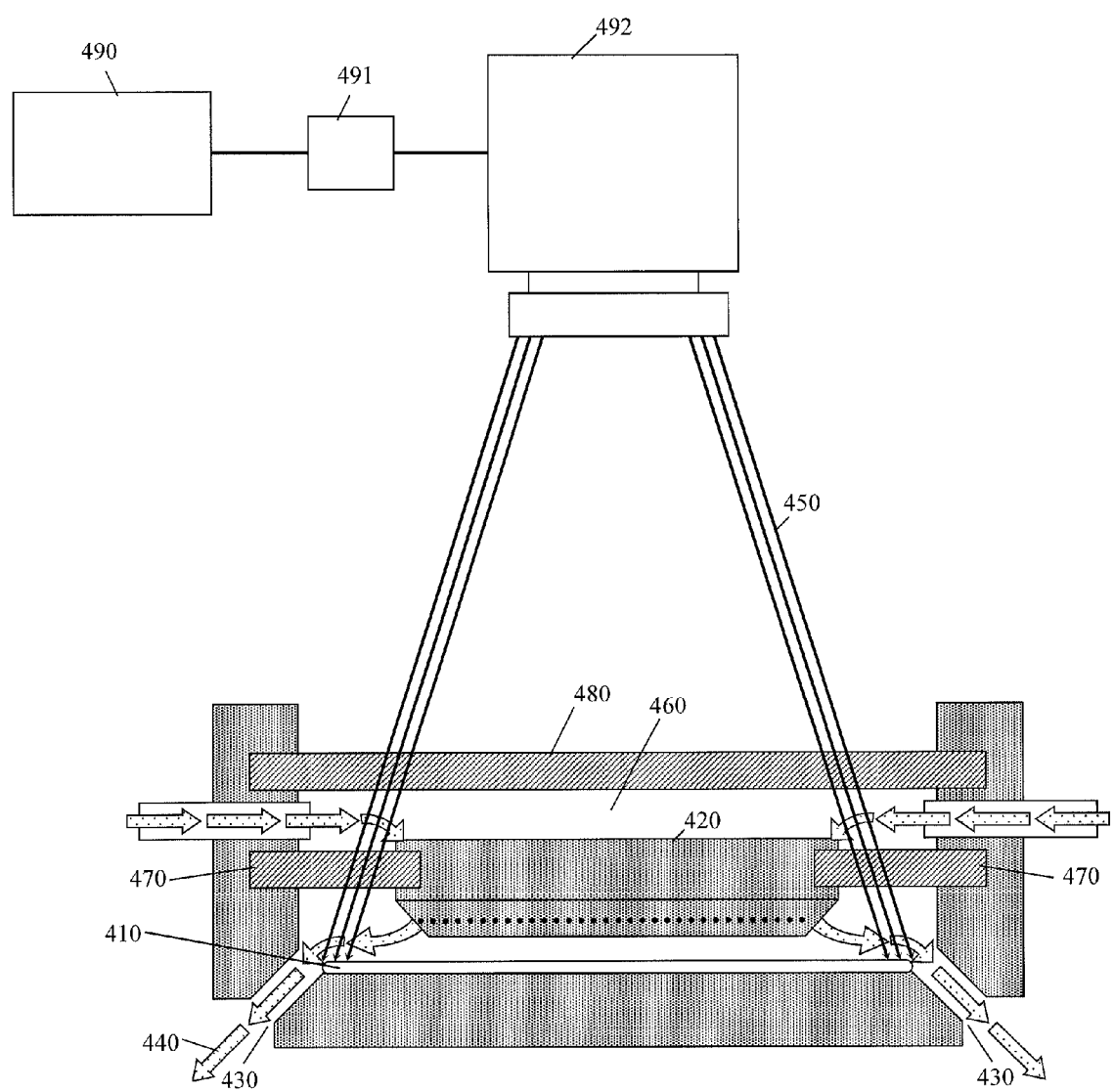
FIG. 15a is a side view that shows how the gas injection ring can be configured without interfering with the laser.
Figure 15B:
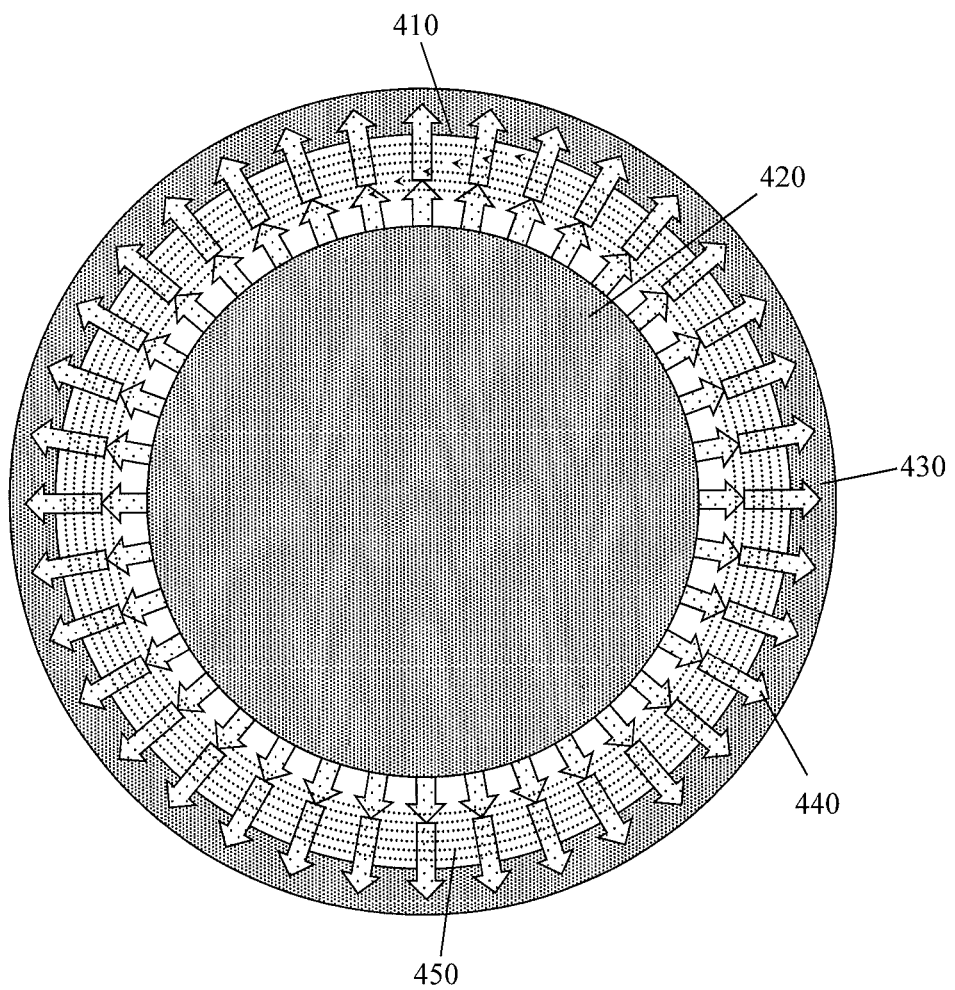
FIG. 15b illustrates a top view of a gas injection ring used with a stationary wafer and a rotating beam.

FIGS. 15a and 15b illustrate another embodiment of an apparatus to process the top edge of a substrate. This apparatus is configured such that the material is removed from a stationary wafer 410, using a rotating beam 450 to process to wafer edge instead of a rotating wafer and a radially scanning beam. A flow of gas 440 is then directed to the edges of the stationery wafer 410 via circumferential injection 420 and exhaust plena 430. Alternately, to process the wafer apex and bottom, a torridal mirror may be used to direct the beam to all of the wafer edges.

FIG. 15a is a side view that shows how the gas injection ring works without interfering with the laser. Here are wafer 410, gas injection block 420, exhaust ring 430, gas flow 440, laser beam 450 circling edge of wafer, plenum 460 feeding into gas injection block, doughnut shaped lower window 470 for holding gas injection block, upper window 480, laser 490, beam shaping optics 491, and scan head 492. FIG. 15b is a top view of the gas injection ring that is used with stationary wafer, showing wafer 410, gas injection block 420, exhaust ring 430, gas flow 440, and the laser beam 450 circling the edge of the wafer.

In preferred embodiments the laser is a Nd:YAG laser and is configured to emit pulsed radiation at a wavelength of 355 nm, with a range of pulse repetition rates from 10,000 Hz to 100,000 Hz, which result in variable power levels and pulse energies. Other YAG lasers can be configured to emit radiation at other repetition rates in a range from 1,000 Hz to 500,000 Hz, and wavelengths such as 213 nm, 266 nm, 532 nm, and 1064 nm. These characteristics may be beneficial to provide higher energy absorption by the material being processed, which leads to more complete reactions, higher throughput, and may enable processes that are ineffective at 355 nm. Other wavelengths, such as 193 nm, 248 nm, or 308 nm produced by an excimer laser, may be useful for certain applications. Still other applications may benefit from the use of a continuous wave (CW) laser such as a 364 nm argon ion laser.

Beam shaping optics may be used to alter the profile of the laser beam. In one embodiment, diffractive beam-shaping optics are used to produce a beam that has a top-hat profile in the scan direction but Gaussian profile in the perpendicular direction. In another embodiment, diffractive beam-shaping optics are used to produce a beam that has a top-hat profile in both axes. In yet another embodiment, a homogenizer is used to create a uniform beam profile. By thus flattening the beam profile, wider process latitude, selective material removal, and sharper edge definition can be achieved.

One application of the systems and methods described herein is to eliminate problems that result after a sub-micron layer of photoresist is spin-coated onto a silicon wafer and baked. This process causes a thickened bead of photoresist at the wafer edge. To prevent peeling and de-lamination by the immersion fluid used in an imaging tool, such as the ASML 193 nm laser-based step-and-scan system, the resulting bead of photoresist on the edge of the wafer must be removed prior to the lithographic step. The present invention provides a method and apparatus for removing this edge bead. If the photoresist bead is not removed, the fluid flows over the wafer during exposure and undercuts the photoresist layer, causing it to lose adhesion, lift at the edges, break off, and re-deposit onto the wafer. This results in the loss of otherwise useable die. In addition, if this bead is not removed, it may stick to robotic handlers and transfer photoresist flakes to other tools and other wafers, causing tool downtime and die loss.

Figure 16A:
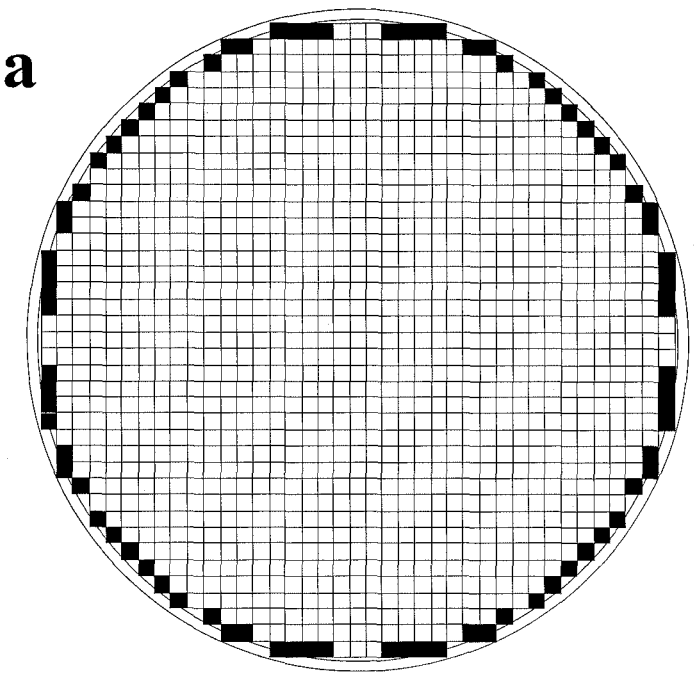
FIG. 16a shows an example of the usable die lost with prior art edge exclusion.
Figure 16B:
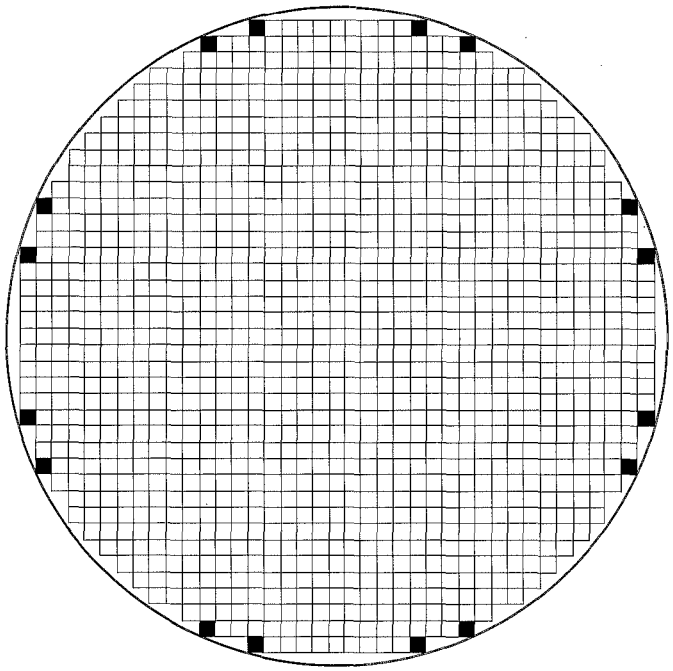
FIG. 16b shows an example of the usable die lost with the presently described edge processing techniques.

Furthermore, in one application of the systems described herein, the edge exclusion width can be reduced from the current 3-5 mm to less than 1 mm. FIG. 16a shows an example of a wafer with a 5 mm edge exclusion, which results in 80 lost die. Using an embodiment described herein, the edge exclusion can be reduced to 0.6 mm, which results in only 16 lost die, as shown in FIG. 16b. In this example, at a wavelength of 355 nm and an energy density of 200 to 700 mJ/cm$^2$, submicron photoresist can be removed in under 5 seconds.

This is an all-dry process with no waste-treatable by-products, without the use of chemicals. Edge cleaning or edge film removal from the top bevel, apex, bottom bevel, and bottom edges of the wafer can also be accomplished during the same process cycle. It may be necessary to process as much as 25 mm from the bottom edge in order to remove the photoresist that had migrated to the bottom side of the wafer. Cleaning the apex is also important since this edge of the wafer contacts the sides of wafer cassettes used during transport in a manufacturing line. Any breaks or cracks in an un-removed edge bead can then create particles that may get transferred to other cassettes and other wafers, causing defects and loss of useable die.

In the second application of photoresist edge-bead removal using the techniques herein, very thick coatings of 2.5 microns, for example, can be removed without leaving any detectable residue. In this application, a 0.6 mm wide edge bead from the top of the wafer was removed in less than 5 seconds of process time with a laser beam shaped into a blade-like geometry with an aspect ratio of greater than 10:1 with the long axis in the circumferential direction. This permits the laser beam to make a sharp slice into the thick photoresist coating, leaving behind a narrow transition between cleaned and uncleaned photoresist. The characteristics of this transition can be varied by changing the shape and edge profile of the incident laser beam. This application was carried out in open atmosphere with 355 nm radiation from the 3rd harmonic of a 12 W Nd:YAG (neodymium-doped yttrium aluminum garnet) laser pulsed at 17 kHz, a 0.1×1.5 mm Gaussian beam with 50% pulse-to-pulse overlap, a peak energy density of 350 mJ/cm$^2$, and a wafer spin rate of 1270 rpm.

In a third edge cleaning application, a tri-layer film is removed. This is a film stack that can be designed to minimize the reflections occurring during lithography, thereby permitting higher imaging resolution to produce advanced semiconductor devices. One example of a tri-layer film, successfully removed by the present invention, consists of a carbon bottom anti-reflection coating (BARC), a silicon BARC layer, and a layer of photoresist. Other examples may include an antireflection coating (ARC), which might be a topcoat over the photoresist layer. The silicon BARC layer can be very difficult to remove by itself, but can be more easily removed in the same process as the photoresist, which is easily removed since it partially absorbs the laser radiation. Similarly, the carbon BARC may be difficult to remove as a single film, but can be more easily removed in the same process as the other films. In order to optimize the process it may be desirable to change the wavelength of the laser to better match the spectral absorption of the various films in the stack.

The laser edge-bead removal method and apparatus described herein permits a much better defined and sharper transition zone between removed and unremoved films than can be achieved with prior art using chemicals, plasma, or mechanical methods. More importantly, the ability to create a more sharply defined sidewall in the post-cleaned film provides more silicon area for useable die and can therefore increase die yield on each wafer, which can result in major revenue increases for semiconductor manufacturers.

In a fourth example of an application, a residue of polishing compound slurry is thermally encapsulated. Such residue is the result of a process called chemical mechanical polishing (CMP), used in multiple steps in the fabrication of semiconductor devices. CMP residue consists of unwanted granular particulates from polishing compounds, typically containing cerium oxide, which is harder than silicon. In the prior art, such residue is etched off using a four-step process, using first a mixture of sulfuric acid and hydrogen peroxide (SC1), then a mixture of ammonium hydroxide and hydrogen peroxide (SC2), followed by a de-ionized water rinse and a drying cycle. These mixtures are heated and are highly corrosive, so that special facilities are required, along with protective equipment for operators and special provisions for hazardous waste disposal.

In accordance with the embodiments described herein, one example of a process for removing this polishing residue uses a 3rd harmonic YAG laser delivering an energy density of 1000 to 2400 mJ/cm$^2$ to thermally encapsulate the slurry residue on the wafer edge by melting and re-flowing the silicon surface. This process typically takes 100 seconds to encapsulate 10 mm of the bottom edge. No corrosive chemicals, water, or drying cycles are required, and there is no hazardous waste as with the prior art methods cited above.

In a fifth example of an application, a post-etch polymer (PEP) residue is removed from the wafer edges. As an example, a reactive ion dry etching step leaves a thin PEP residue as a by-product of the etching process. This residue is extremely difficult to remove due to its chemical nature, being a Teflon-like chlorofluoropolymer. When these residues are present on the bottom side of the wafer, they cause distortion of the wafer on a vacuum chuck causing image distortion during lithography. In an embodiment, a 5 mm annulus of these residues can be removed in 50 seconds using a 12W, 3rd harmonic Nd:YAG laser with an energy density of 500 to 1200 mJ/cm$^2$. The process uses only air as the reactive gas mixture, operates at atmospheric pressure, and does not cause any heat build up during the process. Further, there is no detectable debris or by-products based on high magnification (150,000×) SEM analysis. In a sixth example of an application, a copper film is removed from the edge of a silicon wafer. This application took 14 seconds per mm of copper removed, and was carried out in open atmosphere with 355 nm radiation from the 3rd harmonic of a 12 W Nd:YAG (neodymium-doped yttrium aluminum garnet) laser pulsed at 22 kHz, a 0.25×0.17 mm Gaussian beam with 75% pulse-to-pulse overlap, a peak energy density of 1000 mJ/cm$^2$, and a wafer spin rate of 60 rpm.

In a seventh example of an application, organic and inorganic particles that are generated during semiconductor processing are removed. Particles from the robotic end effectors, wafer cassettes, ion implantation, or other sources during processing may end up on the wafer edge and need to be removed.

For a wide range of applications, laser energy densities used range from 150 to 2500 mJ/cm sq. Although 355 nm radiation, from the 3rd harmonic of a Nd:YAG (neodynium-doped yttrium aluminum garnet) laser, with a pulse width of 30 to 60 ns, is typically used, other wavelengths and other lasers can also be employed. One example is 532 nm radiation from the 2nd harmonic of a Nd:YAG laser, a lower cost laser providing cost reduction to the edge cleaning process. Alternatively, shorter wavelengths such as 266 nm radiation from the 4th harmonic of a Nd:YAG laser, or 193 nm radiation from an ArF excimer laser can be used to remove more difficult materials such as metals and oxides. Other examples of lasers that can be employed in the present invention include a continuous-wave (CW) argon-ion laser, a pulsed KrF excimer laser, and a 1 to 6 ns pulse-width ytterbium-doped YAG laser. We note that for a given energy density, the shorter the pulse width the higher the local, instantaneous substrate temperature will be. Since this higher temperature increases reactivity, it is advantageous in some applications to use a very short pulse-width laser. In light of the above disclosure, it will now be evident to those skilled in the art that a very wide variety of pulsed and CW, gas and solid-state lasers may be used.

The teachings of all patents, published applications and references cited herein are incorporated by reference in their entirety.

While this invention has been particularly shown and described with references to example embodiments thereof, it will be understood by those skilled in the art that various changes in form and details may be made therein without departing from the scope of the invention encompassed by the appended claims. While the preferred embodiment(s) of the present invention(s) are now shown and described, it is envisioned that those skilled in the art may devise various modifications without departing from the spirit and scope of the appended claims, and it is therefore only the claims that define the legal scope of this invention.

What is claimed is:

1. A method for processing material located on at least three or more of a top, top bevel, apex, bottom bevel, or bottom edges of a semiconductor wafer, the method comprising:
    a. rotating the wafer on a chuck in an ambient gas;
    b. delivering a beam of laser radiation from two more locations to the three or more of the top, top bevel, apex, bottom bevel, or bottom edges of the semiconductor wafer to permit interaction of the laser radiation, semiconductor wafer, and the ambient gas, without heating the semiconductor wafer, and further wherein laser radiation is delivered along substantially equal optical paths extending from each of the two locations to three or more of the top, top bevel, apex, bottom bevel, and bottom edges of the substrate; and
    c. evacuating by-products of the interaction of the laser radiation, semiconductor wafer, and the ambient gas.

2. The method as defined in claim 1 where the delivering step further delivers top, apex, and bottom laser radiation beams approximately orthogonally to corresponding wafer edges.

3. The method as described in claim 1 where the two or more wafer edges are cleaned in one process step without removing the wafer from the vacuum chuck.

4. The method as defined in claim 1 where the laser is a pulsed solid-state laser.

5. The method as defined in claim 4 where a laser has a pulse width between 1 and 100 ns.

6. The method as defined in claim 4 where a wavelength of the laser is between 213 nm and 1064 nm.

7. The method as defined in claim 6 where the laser wavelength is 355 nm.

8. The method as defined in claim 4 where a laser repetition rate is between 1,000 Hz and 500,000 Hz.

9. The method as defined in claim 8 where a laser repetition rate is between 10,000 Hz and 100,000 Hz.

10. The method as defined in claim 1 where the laser is a continuous-wave (CW) solid-state laser.

11. The method as defined in claim 1 where the laser is an excimer laser.

12. The method as defined in claim 11 where the laser wavelength is between 193 nm and 308 nm.

13. The method as defined in claim 1 where the laser is a gas laser.

14. The method as defined in claim 13 where the laser wavelength is 364 nm.

15. The method as defined in claim 1 where the ambient gas is selected from the group of an inert, air, oxidizing or reducing gas.

16. The method as defined in claim 1 where the material being removed is a photoresist.

17. The method as defined in claim 1 where the material being removed is a silicon-based polymer film.

18. The method as defined in claim 1 where the laser beam is scanned with a radial component while the wafer is rotating.

19. The method as defined in claim 1 where the material being removed is a dielectric film or film stack.

20. The method as defined in claim 1 where the material being removed is a residue.

21. The method as defined in claim 20 where the material being removed is a post-etch residue.

22. The method as defined in claim 20 where the material being removed is a polishing residue.

23. The method as defined in claim 20 where the material being removed is a photoresist residue.

24. The method as defined in claim 1 where the material being removed is particulate matter.

25. The method as defined in claim 1 where the material being removed is a metal.

26. The method as defined in claim 25 where the metal being removed is copper.

27. The method as defined in claim 1 where the material is removed by a further step of machining the edges of the wafer.

28. The method as defined in claim 1 where the laser beam has a Gaussian profile.

29. The method as defined in claim 1 where the laser beam has a top-hat profile.

30. The method as defined in claim 1 where the laser beam has a top-hat profile in a circumferential direction and a Gaussian profile in a radial direction.

31. The method of claim 18 further comprising:
    a) centering the wafer on the chuck to an accuracy sufficient to avoid gross wobble using a robotic wafer loader;
    b) prior to delivering a beam of laser radiation to the wafer edges, profiling an edge of the wafer with a digital image recorder or an optical micrometer to provide a wafer edge profile;
    c) determining a correction function from the wafer edge profile ; and
    d) during the step of delivering laser radiation to the wafer edges, feeding a signal proportional to the correction function to the radial component, thus keeping the laser beam a precisely controlled distance from the wafer edge as the wafer rotates.

32. The method as defined in claim 1 where the laser beam is blade-shaped with an aspect ratio of at least 10:1.

33. The method as defined in claim 1 where the laser beam has as aspect ratio in the range of 2:1 to 10:1.

34. The method as defined in claim 1 wherein introduction of the laser radiation, water and ambient gas results in removal of material from two or more edges of the water.

35. The method as defined in claim 1 wherein an unwanted material or particles are present on the wafer and interaction of the laser radiation, wafer, and ambient gas results in sufficient energy density to melt two or more of the wafer edges, thereby encapsulating the unwanted material or particles.

36. A method for removing material from at least three of a top, top bevel, apex, bottom bevel, and bottom edges of a wafer, the method comprising:
   a. rotating the wafer on a chuck;
   b. directing a flow of fluid to three or more of the top, top bevel, apex, bottom bevel, and bottom edges of the wafer; and
   c. delivering a beam of laser radiation along to or more optical paths from at least two locations to three or more of the wafer edges, the optical paths being substantially equal, and the laser radiation delivered to permit interaction of the laser radiation, the material being cleaned, and the fluid without heating the semiconductor wafer.

37. The method as defined in claim 36 where the directed fluid is one of an inert gas, air, an oxidizing gas, a reducing gas, a halogenated gas, water in the form of pressurized vapor or steam, pressurized water, or an etchant.

38. The method according to claim 37 where by products are evacuated by means of an exhaust tube.

39. An apparatus comprising:
   a chuck, for rotating a substrate wafer;
   a laser and optics arranged to direct a laser beam from two or more locations to three or more of a top, top bevel, apex, bottom bevel, or bottom edges of the substrate, the optics providing two or more beam paths from the laser to the three or more substrate wafer edges that are substantially equal, to remove material from the wafer edges via interaction of the laser with the wafer edges but without heating the substrate wafer; and
   an exhaust tube.

40. The apparatus of claim 39 in wherein the optics further comprise a scanner arranged to scan the laser beam in a direction with a component orthogonal to a direction of rotation of the wafer.

41. The apparatus of claim 40 further comprising a single-axis galvanometer scanner scans the laser beam in a direction orthogonal to the direction of rotation of the wafer.

42. The apparatus of claim 39 wherein the optics include focusing optics.

43. The method and apparatus of claim 42 wherein said focusing optics comprise an f-theta scan lens.

44. The apparatus of claim 43 wherein said f-theta scan lens is telecentric.

45. The apparatus of claim 43 wherein said f-theta scan lens operates at a diffraction limit.

46. The apparatus of claim 39 when the optics include a multi-mirror sub-assembly arranged to direct the laser beam sequentially onto the top, apex, and bottom of the substrate.

47. The apparatus of claim 46 wherein said multi-mirror subassembly contains a movable mirror that when moved into an "in" position directs the laser beam to the wafer bottom.

48. The apparatus of claim 46 wherein said multi-mirror subassembly contains a movable mirror that when moved into an "in" position directs the laser beam to the wafer apex.

49. The apparatus of claim 46 wherein said multi-mirror subassembly contains a movable mirror that when moved into an "in" position directs the laser beam to a camera.

50. The apparatus of claim 46 wherein said multi-minor subassembly, with one or more movable mirrors moved into an "out" position, directs the laser beam to the substrate top.

51. The apparatus of claim 46 wherein said movable minors are moved by pneumatic cylinders under computer control.

52. The apparatus of claim 46 wherein said movable minors are moved by linear motors under computer control.

53. The apparatus of claim 46 wherein an optical path length of a top, apex, bottom, and camera position of the optics are all nominally equal.

54. The apparatus of claim 53 wherein non-movable mirrors on each beam path are adjustable so that the top, apex, bottom, and camera optical path lengths are made precisely equal.

55. The apparatus of claim 54 wherein pairs of minors are located in the top, apex, and bottom optical paths, and are moved together on stages such that optical path lengths can be adjusted without affecting laser beam alignment.

56. The apparatus of claim 39 where the laser is a pulsed solid-state laser.

57. The apparatus as defined in claim 56 where the laser pulse width is between 1 and 100 ns.

58. The apparatus as defined in claim 56 where the laser wavelength is between 213 nm and 1064 nm.

59. The apparatus as defined in claim 58 where the laser wavelength is 355 nm.

60. The apparatus as defined in claim 56 where the laser repetition rate is between 1,000 Hz and 500,000 Hz.

61. The apparatus as defined in claim 56 where the laser repetition rate is between 10,000 Hz and 100,000 Hz.

62. The apparatus as defined in claim 39 where the laser is a continuous-wave (CW) solid-state laser.

63. The apparatus as defined in claim 39 where the laser is an excimer laser.

64. The apparatus as defined in claim 63 where the laser wavelength is between 193 nm and 308 nm.

65. The apparatus as defined in claim 39 where the laser is a gas laser.

66. The apparatus as defined in claim 65 where the laser is a continuous-wave (CW) laser.

67. The apparatus as defined in claim 66 where the laser wavelength is 364 nm.

68. The apparatus of claim 39 wherein the optics are arranged such that the two or more substrate edges are exposed in a single process step under computer control.

69. The apparatus of claim 39 wherein said substrate is a semiconductor wafer.

70. The apparatus of claim 39 wherein said apparatus is part of a stand-alone edge cleaning system.

71. The apparatus of claim 39 wherein said apparatus is configured into a module for use in an integrated semiconductor processing system.

72. The apparatus of claim 71 wherein said module is used in a track-integrated system.

73. The apparatus of claim 71 wherein said module is used in a cluster tool processing system.

74. The apparatus of claim 40 further comprising:
   a) a robotic wafer loader
   b) a digital image recorder or optical micrometer configured to map the wafer edge as a wafer edge profile;
   c) a programmable processor, for executing stored instructions in the form of computer code, to convert the wafer edge profile into a radial correction function; and
   d) circuitry to supply the radial correction function to the scanner.

75. A method for processing the edges of a substrate comprising:
   a. delivering a beam of laser radiation from two or more locations to the top, bottom, and apex edges of the substrate in sequential order and further wherein the delivering step delivers laser radiation along substantially equal optical paths extending from each of the two or more locations to three or more of the top, top bevel, apex, bottom bevel, and bottom edges of the substrate without heating the substrate;

b. moving the beam and substrate relative to one another;

c. delivering a flow of a fluid to a reaction region adjacent the substrate edges, thereby removing material adjacent the substrate edges; and d. removing any by-products in an exhaust flow.

76. The method of claim 75 in which a toroidal mirror is used to direct the beam to the apex and bottom edges of the substrate.

77. A method for processing material located on edges of a semiconductor wafer comprising:

rotating the wafer on a chuck in an ambient gas;

producing a first laser beam of laser radiation;

delivering the first laser beam to a beam splitter to produce a pair of split beams;

directing each of the pair of split beams to a respective one of a pair of mirrors, to further direct each of the split beams to the semiconductor wafer at an angle of less than 90 degrees with respect to a horizontal plane of the semiconductor wafer, the two split beams being directed along equal length optical paths to two or more edges of the semiconductor wafer, and thereby permitting interaction of the laser radiation, the semiconductor wafer, and the ambient gas without heating the substrate; and evacuating by-products of the interaction of the laser radiation, semiconductor wafer, and the ambient gas.

78. The method of claim 77 wherein the step of directing each of the split beams directs the beams at 45 degrees with respect to the horizontal plane of the semiconductor wafer.

79. The method of claim 77 wherein the step of directing each of the split beams directs the beams at an angle that is not tangential to a respective edge within the horizontal plane of the semiconductor wafer.

80. The method of claim 77 wherein optical path lengths of each of the two split beams from the respective mirrors to three or more of the top, top bevel, apex, bottom bevel, and bottom edges of the substrate are substantially equal.

\* \* \* \* \*

UNITED STATES PATENT AND TRADEMARK OFFICE
CERTIFICATE OF CORRECTION

PATENT NO. : 8,658,937 B2
APPLICATION NO. : 12/986914
DATED : February 25, 2014
INVENTOR(S) : Kenneth J. Harte et al.

Page 1 of 1

It is certified that error appears in the above-identified patent and that said Letters Patent is hereby corrected as shown below:

In the Claims:
Claim 36, col. 21, line 8:
~~c. delivering a beam of laser radiation along to or more~~ should read
c. delivering a beam of laser radiation along two or more Claim 50, col. 21, line 60:
~~50. The apparatus of claim 46 wherein said multi-minor~~ should read
50. The apparatus of claim 46 wherein said multi-mirror Claim 51, col. 21, line 64:
~~minors are moved by pneumatic cylinders under computer~~ should read
mirrors are moved by pneumatic cylinders under computer Claim 52, col. 21, line 67:
~~minors are moved by linear motors under computer control.~~ should read
mirrors are moved by linear motors under computer control.

Claim 55, col. 22, line 8:
~~55. The apparatus of claim 54 wherein pairs of minors are~~ should read
55. The apparatus of claim 54 wherein pairs of mirrors are Signed and Sealed this
Sixth Day of May, 2014

Michelle K. Lee
*Deputy Director of the United States Patent and Trademark Office*